US008756548B2

(12) United States Patent
Zievers

(10) Patent No.: US 8,756,548 B2
(45) Date of Patent: Jun. 17, 2014

(54) COMPUTING SYSTEM WITH HARDWARE RECONFIGURATION MECHANISM AND METHOD OF OPERATION THEREOF

(75) Inventor: Peter J Zievers, Naperville, IL (US)

(73) Assignee: Xcelemor, Inc., Danville, CA (US)

( * ) Notice: Subject to any disclaimer, the term of this patent is extended or adjusted under 35 U.S.C. 154(b) by 0 days.

(21) Appl. No.: 13/464,873

(22) Filed: May 4, 2012

(65) Prior Publication Data

US 2012/0284502 A1  Nov. 8, 2012

Related U.S. Application Data

(60) Provisional application No. 61/483,523, filed on May 6, 2011.

(51) Int. Cl.
| | |
|---|---|
| *G06F 9/24* | (2006.01) |
| *G06F 15/177* | (2006.01) |
| *G06F 1/24* | (2006.01) |
| *G06F 17/50* | (2006.01) |

(52) U.S. Cl.
CPC ........ *G06F 17/5027* (2013.01); *G06F 17/5054* (2013.01); *G06F 9/24* (2013.01); *G06F 1/24* (2013.01); *G06F 15/177* (2013.01)
USPC ............. 716/117; 716/121; 716/128; 703/16; 713/2; 713/100

(58) Field of Classification Search
CPC ... G06F 17/5027; G06F 17/5054; G06F 9/24; G06F 1/24; G06F 15/177
USPC .......... 716/117, 121, 128; 703/16; 713/2, 100
See application file for complete search history.

(56) References Cited

U.S. PATENT DOCUMENTS

| | | | |
|---|---|---|---|
| 5,521,837 A * | 5/1996 | Frankle et al. ................ 716/113 |
| 6,086,631 A * | 7/2000 | Chaudhary et al. ........... 716/116 |
| 6,099,583 A * | 8/2000 | Nag ............................. 716/117 |
| 6,292,916 B1 | 9/2001 | Abramovici et al. |
| 6,434,687 B1 | 8/2002 | Huppenthal |
| 6,442,732 B1 | 8/2002 | Abramovici et al. |
| 6,470,415 B1 | 10/2002 | Starr et al. |
| 6,697,868 B2 | 2/2004 | Craft et al. |
| 6,784,903 B2 | 8/2004 | Kodosky et al. |
| 6,941,539 B1 | 9/2005 | Hammes |
| 6,964,029 B2 | 11/2005 | Poznanovic et al. |
| 6,990,649 B2 * | 1/2006 | Claras ........................... 716/130 |
| 7,028,281 B1 * | 4/2006 | Agrawal et al. ................ 326/41 |
| 7,120,706 B2 | 10/2006 | Zievers |

(Continued)

OTHER PUBLICATIONS

Babb et al., "Virtual Wires: Overcoming Pin Limitations in FPGA-based Logic Emulators", p. 10, Publisher: MIT Laboratory for Computer Science, Published in: Cambridge, US.

(Continued)

*Primary Examiner* — Phallaka Kik
(74) *Attorney, Agent, or Firm* — Ishimaru & Associates LLP

(57) ABSTRACT

A method for operating a computing system includes: receiving an application-tree for instantiating an application in a reconfigurable hardware device; operating a kernel unit for determining an unoccupied logic-sector within a reconfigurable hardware device; calculating a layout section from the application-tree according to the unoccupied logic-sector for instantiating a fragment circuitry corresponding to the layout section; and determining a system table for connecting the fragment circuitry to other portions of the application to form the application having the fragment circuitry.

20 Claims, 8 Drawing Sheets

(56) References Cited

U.S. PATENT DOCUMENTS

| | | | |
|---|---|---|---|
| 7,159,049 | B2 | 1/2007 | Zievers |
| 7,162,551 | B2 | 1/2007 | Zievers |
| 7,831,943 | B1* | 11/2010 | Das .............................. 716/106 |
| 8,595,671 | B2* | 11/2013 | He ................................. 716/116 |
| 2004/0088691 | A1 | 5/2004 | Hammes et al. |
| 2005/0108464 | A1 | 5/2005 | Zievers |
| 2006/0074938 | A1* | 4/2006 | Miller ........................... 707/100 |
| 2006/0206850 | A1* | 9/2006 | McCubbrey .................... 716/17 |
| 2007/0078988 | A1 | 4/2007 | Miloushev et al. |
| 2007/0288871 | A1* | 12/2007 | McElvain et al. ................. 716/2 |
| 2008/0184241 | A1* | 7/2008 | Headrick et al. ............. 718/102 |
| 2008/0216038 | A1* | 9/2008 | Bose ................................. 716/8 |
| 2009/0172666 | A1 | 7/2009 | Yahalom |
| 2010/0079302 | A1 | 4/2010 | Eide et al. |
| 2010/0262779 | A1 | 10/2010 | Potkonjak |
| 2010/0281448 | A1* | 11/2010 | He .................................... 716/6 |
| 2011/0055449 | A1* | 3/2011 | Koch et al. .................... 710/306 |
| 2011/0113399 | A1* | 5/2011 | Vujkovic et al. .............. 716/129 |
| 2011/0145447 | A1 | 6/2011 | Dimond |
| 2011/0302231 | A1 | 12/2011 | Huggett et al. |

OTHER PUBLICATIONS

Compton et al., "An Introduction to Reconfigurable Computing",, p. 9 Publisher: Northwestern University, Published in: Evanston, US.

Gomez-Prado et al., "A Tutorial on FPGA Routing",, p. 16, Publisher: Department of Electrical and Computer Engineering. University of Massachusetts, Published in: Amherst, US.

Todman et al., "Reconfigurable computing: architectures and design methods", "IEE Proc.—Comput. Digit. Tech., vol. 152, No. 2, Mar. 2005", Mar. 2005, p. 15, Publisher: IEEE.

Vancourt et al., "Sizing of Processing Arrays for FPGA-Based Computation", p. 6, Publisher: Boston University, Department of Electrical and Computer Engineering, Published in: Boston, US.

International Search Report from PCT Application No. PCT/US2012/36673 dated Feb. 1, 2013.

* cited by examiner

COMPUTING SYSTEM WITH HARDWARE RECONFIGURATION MECHANISM AND METHOD OF OPERATION THEREOF

CROSS-REFERENCE TO RELATED APPLICATION

This application claims the benefit of U.S. Provisional Patent Application Ser. No. 61/483,523 filed May 6, 2011, and the subject matter thereof is incorporated herein by reference in its entirety.

TECHNICAL FIELD

The present invention relates generally to a computing system and more particularly to a system for hardware reconfiguration.

BACKGROUND ART

Electronic hardware with integrated circuits is used in virtually all electronic equipment today and has revolutionized the world of electronics. The integrated circuits are used in digital computing systems, such as computers, televisions, cellular phones, mobile devices, and digital video cameras.

The integrated circuits that enable virtually every electronics gadget used on a daily basis are constantly being pushed by the semiconductor industry to become faster. However, pure hardware implementation does not allow the flexibility to address the myriad of applications in modern computing system.

Thus, a need still remains for computing systems with flexibility of more functions as well as increased speed. In view of the increasing demand for computing systems with improved integration and performance, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a computing system, including: receiving an application-tree for instantiating an application in a reconfigurable hardware device; operating a kernel unit for determining an unoccupied logic-sector within a reconfigurable hardware device; calculating a layout section from the application-tree according to the unoccupied logic-sector for instantiating a fragment circuitry corresponding to the layout section; and determining a system table for connecting the fragment circuitry to other portions of the application to form the application having the fragment circuitry.

The present invention provides a computing system, including: a user interface unit for receiving an application-tree for instantiating an application in a reconfigurable hardware device; a resource manager, coupled to the user interface unit, operating a kernel unit for determining an unoccupied logic-sector within a reconfigurable hardware device; a layout calculator, coupled to the user interface unit, for calculating a layout section from the application-tree according to the unoccupied logic-sector for instantiating a fragment circuitry corresponding to the layout section; and a database-manager, coupled to the user interface unit, for determining a system table for connecting the fragment circuitry to other portions of the application to form the application having the fragment circuitry.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and procedural steps are not disclosed in detail.

The term "module" referred to herein includes hardware in the present invention in accordance with the context in which the term is used. For example, the hardware can include circuitry, programmable circuitry, computer, integrated circuit, integrated circuit cores, a pressure sensor, an inertial sensor, a microelectromechanical system (MEMS), passive devices, or a combination thereof.

The term "resource" referred to herein includes hardware that can be used to form or use circuitry. For example, the resource can include logic gates, transistors, switches, connections such as buses or hardwire connections, memory devices and portions therein, passive devices, or a combination thereof.

Figure 1:
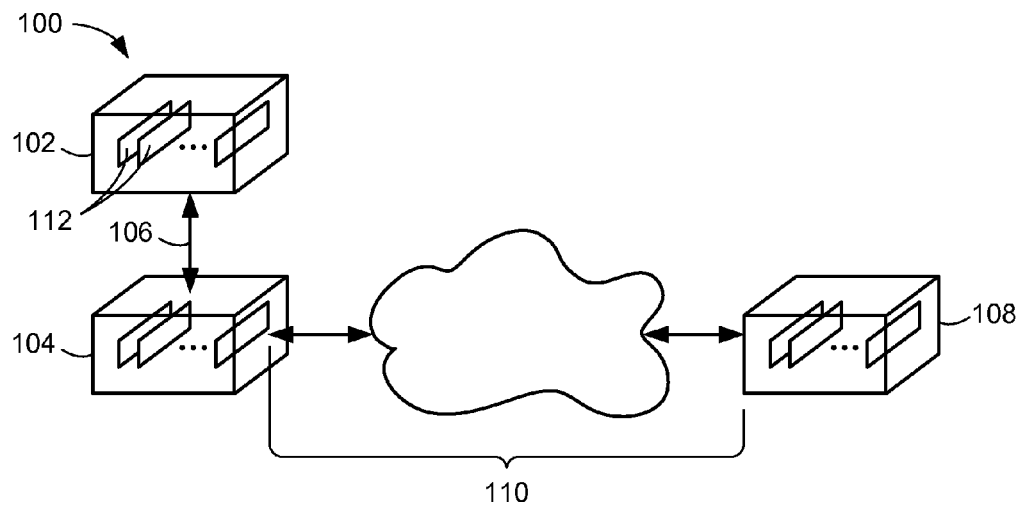
FIG. 1 is a computing system with hardware reconfiguration mechanism in an embodiment of the present invention.

Referring now to FIG. 1, therein is shown a computing system 100 with hardware reconfiguration mechanism in an embodiment of the present invention. The computing system 100 can represent an adaptive architecture execution environment (AAXE).

The computing system 100 can include a first electronic equipment 102 connected to a second electronic equipment 104 through a first communication path 106. The computing system 100 can include a third electronic equipment 108 connected to the second electronic equipment 104 through a second communication path 110.

For example, the first electronic equipment 102, the second electronic equipment 104, or the third electronic equipment 108 can represent a non-mobile device or a mobile device. As specific examples, the first electronic equipment 102, the second electronic equipment 104, or the third electronic equipment 108 can be a server, a server farm, a computer, a grid-computing resource, a virtualized computer resource, a cloud computing resource, a router, a switch, a peer-to-peer distributed computing device, a network equipment, a storage enclosure, or a combination thereof. As additional specific examples, the first electronic equipment 102, the second electronic equipment 104, or the third electronic equipment 108 can be a cellular phone, a personal digital assistant, a notebook computer, a multi-functional mobile communication device, or an entertainment device.

The first communication path 106, as an example, can represent a wireless network, a wired network, or a combination thereof for box-to-box connectivity. The first communication path 106 can include wireless communication, wired communication, optical, ultrasonic, or a combination thereof. Bluetooth, Infrared Data Association standard (IrDA), wireless fidelity (WiFi), and worldwide interoperability for microwave access (WiMAX) are examples of wireless communication for the first communication path 106. Ethernet, Fiber Channel, and Peripheral Component Interconnect (PCI) are also examples of wired communication for the first communication path 106.

The second communication path 110, for example, can represent a wireless network, a wired network, or a combination thereof for connectivity over a network. The second communication path 110 can include wireless communication, wired communication, optical, ultrasonic, cloud network, or a combination thereof Satellite communication, cellular communication, Bluetooth, Infrared Data Association standard (IrDA), wireless fidelity (WiFi), and worldwide interoperability for microwave access (WiMAX) are examples of wireless communication for the second communication path 110. Ethernet, digital subscriber line (DSL), fiber to the home (FTTH), and plain old telephone service (POTS) are also examples of wired communication for the second communication path 110.

Further, the second communication path 110 can traverse a number of network topologies and distances. For example, the second communication path 110 can include direct connection, personal area network (PAN), local area network (LAN), metropolitan area network (MAN), wide area network (WAN), or any combination thereof. Also for example, the second communication path 110 can support timing requirements or quality of service (QoS) features.

Each of the first electronic equipment 102, the second electronic equipment 104, and the third electronic equipment 108 can include a number of line cards 112, which are defined as modular electronic sub-systems. The line cards 112 can be connected together on a backplane or with cables for inside-a-box connectivity. The line cards 112 can be connected together using connectivity methods including electrical connectors, optical fiber connectors, or wave-guide connectors.

The line cards 112 can include an electronic component including an application-specific integrated circuit (ASIC), a field-programmable gate array (FPGA). For example, the line cards 112 can represent server blades, expansion cards, or interface cards for routers or switches.

Figure 2:
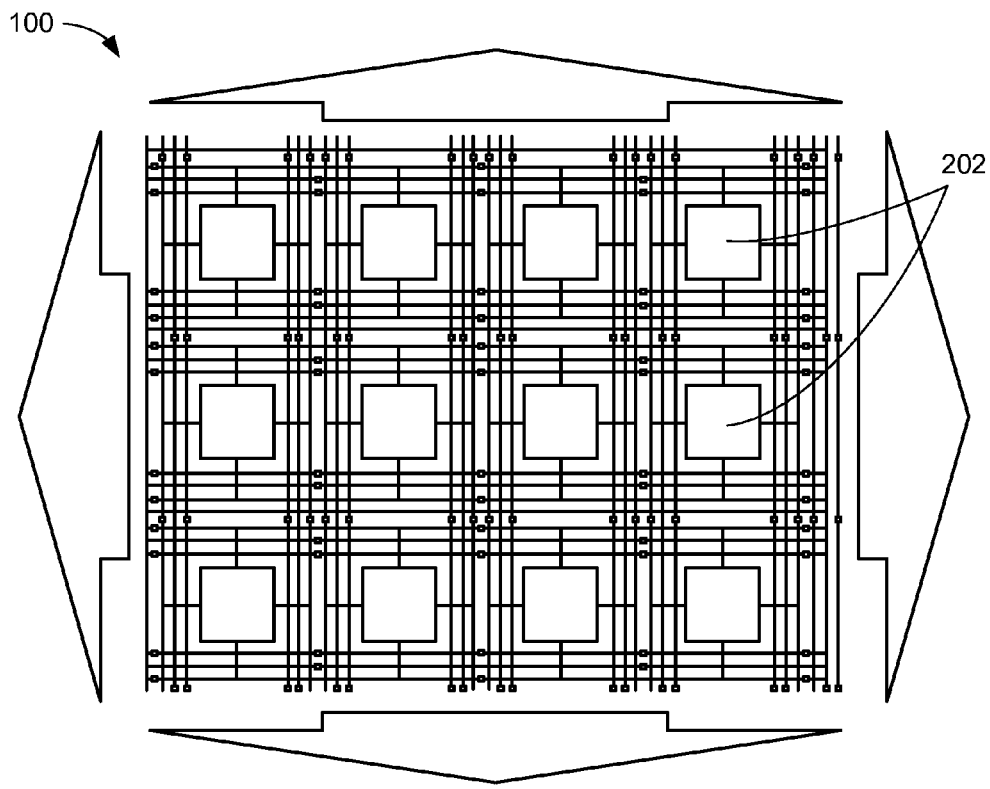
FIG. 2 is an architecture diagram of the computing system.

Referring now to FIG. 2, therein is shown an architecture diagram of the computing system 100. The computing system 100 can include a number of reconfigurable hardware devices 202. The reconfigurable hardware devices 202 are defined as programmable devices in which functionality of logic gates, storage elements, and interconnections are customizable or can be dynamically configured during operation to include changed functions within the programmable devices. The reconfigurable hardware devices 202 can also include a number of other hardware devices, such as central processing units (CPU), graphic processing units (GPU), ASICs, or a combination thereof in the computing system 100.

The reconfigurable hardware devices 202 can represent the programmable devices with a configurable pool of programmable blocks and reconfigurable interconnects. For example, the reconfigurable interconnects can represent wires or zero-delay interconnection resources. The architecture diagram is depicted with arrows to indicate that any number of the reconfigurable hardware devices 202 can be placed, routed, and interconnected.

Placement, routing, and interconnections among a number of the reconfigurable hardware devices 202 can be configurable at run-time. A number of the reconfigurable hardware devices 202 can be placed and routed to interconnect or interface to one another on one or more of the line cards 112 of FIG. 1.

For example, the reconfigurable hardware devices 202 can represent the programmable devices including field-programmable gate arrays (FPGAs), programmable logic devices (PLDs), or any other programmable hardware devices. Also for example, the reconfigurable hardware devices 202 can represent target programmable devices. Further for example, interconnections between the reconfigurable hardware devices 202 can represent the first communication path 106 of FIG. 1, the second communication path 110 of FIG. 1, a backplane, or with cables for inside-a-box connectivity.

Figure 3:
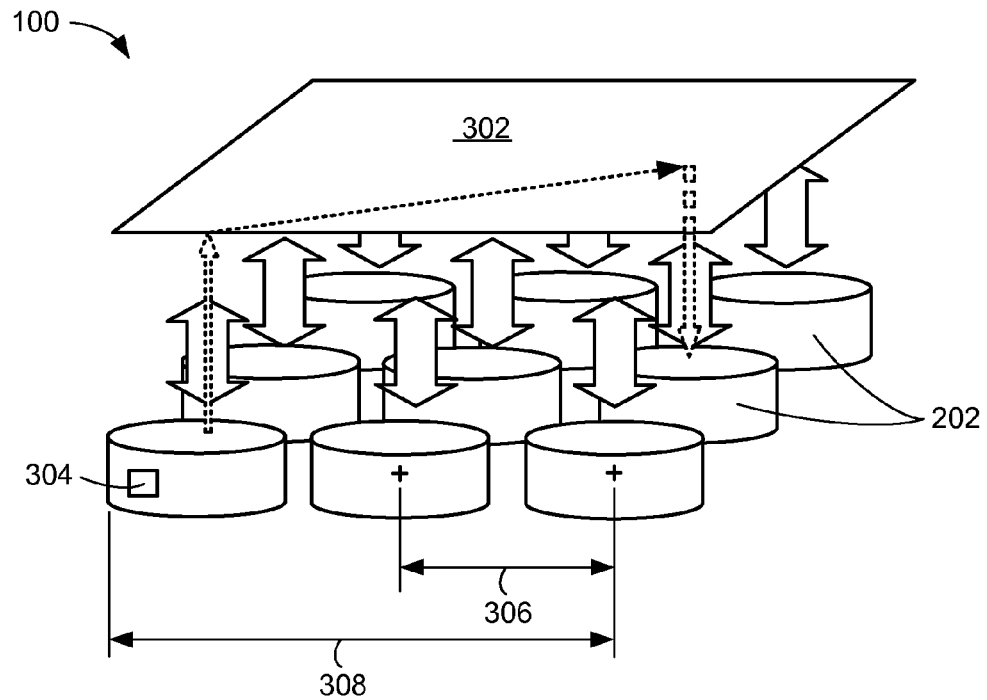
FIG. 3 is a connection diagram of a cross-connection network of the reconfigurable hardware devices.

Referring now to FIG. 3, therein is shown a connection diagram of a cross-connection network 302 of the reconfigurable hardware devices 202. The connection diagram depicts a hierarchical connection that enables the reconfigurable hardware devices 202 to be interconnected. The cross-connection network 302 is defined as an interconnection of hardware resources.

One of the reconfigurable hardware devices 202 can interface to another of the reconfigurable hardware devices 202 through the cross-connection network 302 in a path shown with dash arrows. For example, the cross-connection network 302 can represent the interconnections between the reconfigurable hardware devices 202.

Delay incurred by traversing the cross-connection network 302 can be regulated by managing a number of hierarchical levels in the cross-connection network 302 at implementation time. The implementation time is a time when the reconfigurable hardware devices 202, the line cards 112 of FIG. 1, and a combination thereof are connected together through the cross-connection network 302 before the reconfigurable hardware devices 202 and the line cards 112 are available for operation.

The delay can also be regulated by managing a locality of an application 304 at run-time. The application 304 is defined as a set of instructions and operations for transforming electrical inputs to electrical outputs that is to be invoked and formed into hardware circuitry in the reconfigurable hardware devices 202 of the computing system 100. The application 304 can be pre-defined by an application developer.

The computing system 100 can execute the application 304 by forming the hardware circuitry and handling input and output signals according to the application 304. For illustration purposes, one of the reconfigurable hardware devices 202 is shown to execute the application 304, although it is understood that any number of the reconfigurable hardware devices 202 can be allocated to execute the application 304.

The locality can be provided by mapping the application 304 to one of the reconfigurable hardware devices 202 or multiple of the reconfigurable hardware devices 202 that are within a predetermined distance 306 from each other. The predetermined distance 306 is a distance between centers of the reconfigurable hardware devices 202 that that is less than a distance threshold 308 to ensure a propagation delay less than a fixed numerical value. The distance threshold 308 is a predefined numerical value for determining whether the reconfigurable hardware devices 202 are locally or closely located to each other.

The cross-connection network 302 can include management functions to be effective. A number of the application 304 can discreetly avail themselves of network management functionality through a control interface, leaving complex network maintenance to logic that operates separately from the number of the application 304.

A single application management approach can pre-empt or prevent occurrences of mismatched approaches, which are multiple methods of a variety of sub-systems having conflicting effects in an overall system. The single application management approach provides a single coordination to ensure resources are available for use resulting in efficient implementation of the network control plane by making the network homogeneous.

For example, the occurrences can include resource leakage, resource collision, resource starvation, application deadlock, namespace conflict, cross-thread run-time synchronization failure, and cross-thread communication disconnect. As a specific example, the resource leakage occurs when applications cannot use the resources available, for example, when the resource handles have been lost thereby rendering the resources unusable because the allocation routines refer to resources by their handles. As another specific example, the resource collision occurs when multiple devices or processes access the same instances of the resources.

As another specific example, the resource starvation occurs when the resources are not allocated for execution of a process because they are used for execution of another process having a higher priority than the process. As another specific example, the application deadlock occurs when two or more processes are simultaneously waiting for each other to free up the resources.

Application logic that is not able to be fit or implemented into a single instance of the reconfigurable hardware devices 202 can require application synchronization at device input ports of each of the reconfigurable hardware devices 202 that are used to implement and execute the application logic. Multiple approaches to the application synchronization can be supported assuming orthogonal application domains, which are groups of applications that are different and operate independently from each other.

The number of the application 304 can coexist in the computing system 100 and therefore can use the same system resources including a memory control interface (not shown) and a network control interface (not shown). Consistency of the application synchronization that applies the same terms and protocols can promote application independence and therefore scalability.

Figure 4:
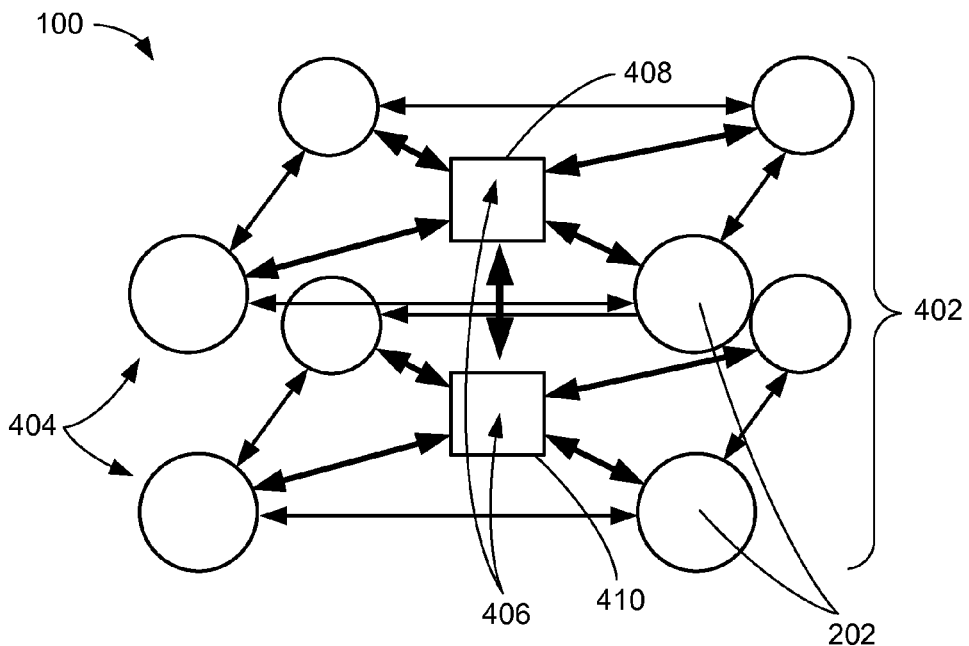
FIG. 4 is a connection diagram of a tandem kernel of the computing system.

Referring now to FIG. 4, therein is shown a connection diagram of a tandem kernel 402 of the computing system 100. The tandem kernel 402 is defined as more than one of clusters 404 connected together.

Each of the clusters 404 is defined as a collection of the reconfigurable hardware devices 202 connected to kernel units 406, whereby the reconfigurable hardware devices 202 are locally located with respect to one another. The term "locally located" refers to the reconfigurable hardware devices 202 within the predetermined distance 306 of FIG. 3 from one another. The computing system 100 can include a number of the clusters 404 connected together through a number of the kernel units 406. Each of the kernel units 406 is defined as a management hardware that includes application management, communication, and synchronization functionality.

The connection diagram depicts the tandem kernel 402 having a main kernel instance 408 connected to a coupled kernel instance 410, with each of the main kernel instance 408 and the coupled kernel instance 410 having four instances of the reconfigurable hardware devices 202. Within the tandem kernel 402, one of the reconfigurable hardware devices 202 of the main kernel instance 408 can interface with one of the reconfigurable hardware devices 202 of the coupled kernel instance 410.

The main kernel instance 408 is an arbitrarily designated instance of the kernel units 406 for illustrating individual instances of the kernel units 406. The coupled kernel instance 410 is an arbitrarily designated instance of the kernel units 406 for illustrating the interaction between the kernel units 406.

It is understood that the main kernel instance 408 or the coupled kernel instance 410 are not special instances amongst the kernel units 406 and that the kernel units 406 can have identical structures. It is further understood that the main kernel instance 408 and the coupled kernel instance 410 are management hardware that each include application management, communication, and synchronization functionality.

One of the reconfigurable hardware devices 202 can interface with another of the reconfigurable hardware devices 202 within one of the clusters 404 preferably through one of the kernel units 406 of the one of the clusters 404. Optionally, one of the reconfigurable hardware devices 202 of one of the clusters 404 can interface directly with another of the reconfigurable hardware devices 202 of the one of the clusters 404. A number of the kernel units 406 and interconnections between the reconfigurable hardware devices 202 and the number of the kernel units 406, among the number of the kernel units 406, among the reconfigurable hardware devices 202, or a combination thereof can represent portions of the cross-connection network 302 of FIG. 3.

For illustrative purposes, the clusters 404 are shown as having four instances of the reconfigurable hardware devices 202 but it is understood that the clusters 404 can be configured differently. For example, the clusters 404 can have any number of instances of the reconfigurable hardware devices 202 or have different number of the reconfigurable hardware devices 202 for each instance of the clusters 404.

It has been discovered that each of the clusters 404 having one of the kernel units 406 provides improved dynamic allocation of hardware resources because the application 304 of FIG. 3 can be fragmented, mapped, and executed with any number of the reconfigurable hardware devices 202 interface with each other through the one of the kernel units 406.

It has also been discovered that any number of the reconfigurable hardware devices 202 directly interface with each other within one of the clusters 404 provides improved performance with less delays through direct connections as well as provides reduced cost and complexity.

Figure 5:
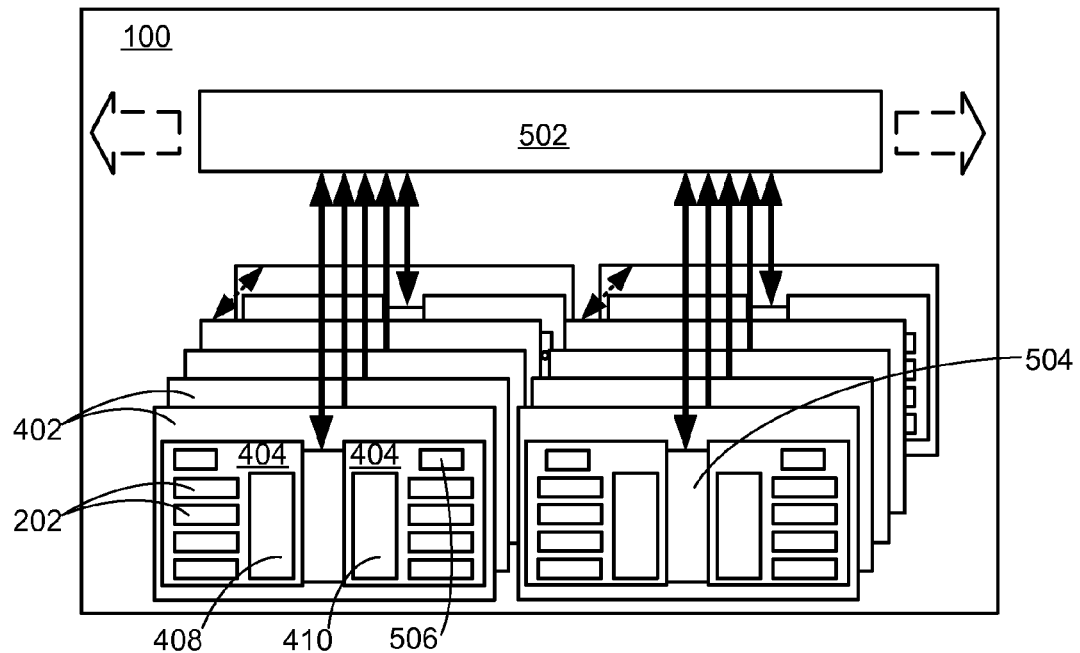
FIG. 5 is a hardware block diagram of the computing system.

Referring now to FIG. 5, therein is shown a hardware block diagram of the computing system 100. The computing system 100 includes a hardware platform with a number of the kernel units 406 of FIG. 4, a number of the reconfigurable hardware devices 202, and a communication network 502 that can be engaged and interworking together as a system. For example, the computing system 100 can include kernel peers such as the main kernel instance 408 and the coupled kernel instance 410.

The computing system 100 includes a dynamic reconfigurable computing platform without any external software intervention during real-time operation. For example, the computing system 100 can provide a complete hardware platform.

The communication network 502 provides an interface and connectivity for the tandem kernel 402 to communicate with another of the tandem kernel 402. The communication network 502 can include switches and communication protocols for sending control information and data between one of the kernel units 406 of the tandem kernel 402 to one of the kernel units 406 of another of the tandem kernel 402.

The tandem kernel 402 can include a communication interface 504 to provide communication between the tandem kernel 402 and another of the tandem kernel 402. The communication interface 504 can also provide communication between one of the kernel units 406 and another of the kernel units 406. For example, the communication interface 504 can represent a network interface.

The communication interface 504 can be used for one of the kernel units 406 of the tandem kernel 402 to communicate with one of the kernel units 406 of another of the tandem kernel 402 through the communication network 502. The communication network 502, the communication interface 504, a number of the kernel units 406, or a combination thereof can represent portions of the cross-connection network 302 of FIG. 3. For example, a number of the tandem kernel 402 can be included on a number of the line cards 112 of FIG. 1. Also for example, a number of the tandem kernel 402 can represent the first electronic equipment 102 of FIG. 1, the second electronic equipment 104 of FIG. 1, or the third electronic equipment 108 of FIG. 1.

The computing system 100 can accommodate a number of different models of the reconfigurable hardware devices 202, each of which can include different input/output (I/O) densities and different computing resources. Suitability of the reconfigurable hardware devices 202 can depend on an application characteristic 506, which is defined as operating parameter of the application 304 of FIG. 3 that determines how the reconfigurable hardware devices 202 are to be allocated for executing the application 304.

The application characteristic 506 can include the operation feature including input/output-intensive (I/O-intensive) or compute-intensive. For example, the application characteristic 506 can be used to determine a mix of the application 304.

I/O-intensive refers to the application 304 that is preferably mapped to programmable hardware resources with a high I/O activity. The high I/O activity refers to a number of input and output ports of a programmable hardware resource greater than a predefined numerical value of input and output ports. For example, the predefined numerical value of input and output ports can be 600. Also for example, I/O-intensive can represent I/O-heavy or high I/O density.

Compute-intensive refers to the application 304 that is preferably mapped to programmable hardware resources with a high compute resource capacity. Compute-intensive applies to the application 304 that demands a lot of computation compared to I/O-intensive that requires more input/output operations.

The application 304 that is I/O-intensive can be placed, routed, and executed better using a selected model of the reconfigurable hardware devices 202 that is designed for I/O-intensive applications than those for compute-intensive applications. The application 304 that is compute-intensive can be placed, routed, and executed more efficiently using a different model of the reconfigurable hardware devices 202 that is designed for resource-intensive than those for I/O-intensive.

The computing system 100 can be tuned or configured by mixing the clusters 404 differently based on the application characteristic 506. The clusters 404 can represent kernel planes. For example, the application characteristic 506 of the application 304 can be particularly I/O-intensive but the application 304 has compute-intensive ancillary functionality that is most frequently unused. As well, the application 304 may have portions that are particularly input-output intensive, while other portions of the application 304 are compute intensive.

In the example above, the clusters 404 populated with high I/O density instances of the reconfigurable hardware devices 202 can be employed for execution of basic functionality of the application 304. In addition, the clusters 404 populated with compute resource intensive instances of the reconfigurable hardware devices 202 can be employed for execution of the compute-intensive ancillary functionality that is swapped in and out of the compute resource intensive instances of the reconfigurable hardware devices 202.

Each of the clusters 404 can be analyzed to estimate an amount of time for executing a functionality of the application 304 based on an actual capacity (or size) and an actual I/O density of the reconfigurable hardware devices 202 that are used to map the application 304. As an application mix of a number of the application 304 runs in the computing system 100, performance can be measured and a mix of the clusters 404 can be adjusted according to actual run-time characteristics. The application mix refers to the number of the application 304 that need to be mapped to resources that are I/O-intensive, compute-intensive, or a combination thereof.

Placement of the clusters 404 can depend on the application mix. If an I/O-intensive functionality of the application 304 is localized in the reconfigurable hardware devices 202, the clusters 404 that are I/O-intensive can be clustered together, thereby decongesting the communication network 502 of the computing system 100. If an I/O-intensive functionality of the application 304 functions as a hub for a compute-intensive functionality, the clusters 404 that are I/O-intensive can be distributed amongst the clusters 404 that are compute-intensive.

Figure 6:
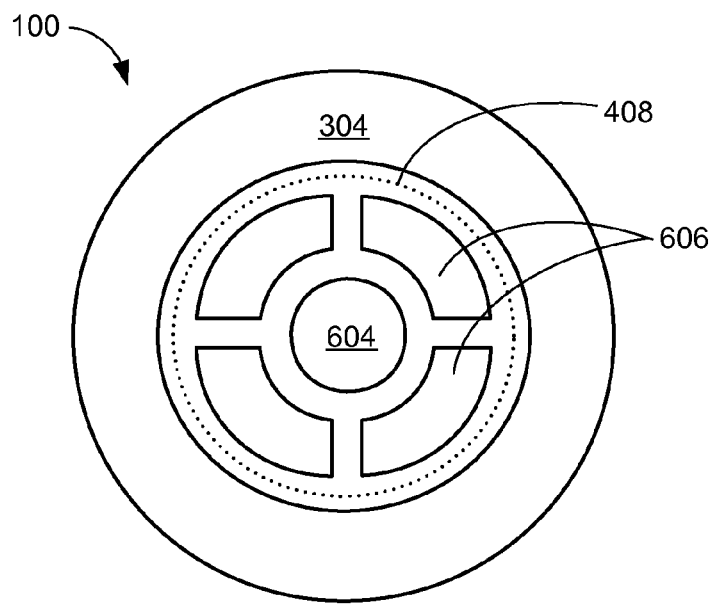
FIG. 6 is an architecture diagram of the application in the computing system.

Referring now to FIG. 6, therein is shown an architecture diagram of the application 304 in the computing system 100.

Each of the kernel units 406 of FIG. 4, including the main kernel instance 408, can include a microkernel 604 and kernel modules 606. The microkernel 604 can provide control, management, and communication capabilities for each of the kernel units 406 to interface with the reconfigurable hardware devices 202 of FIG. 2 to implement and execute functionality of the application 304.

The kernel modules 606 augment functionality of the microkernel 604 by providing additional control and management capabilities that are not implemented in the microkernel 604. The kernel units 406 can be configured for the application 304 by compiling and synthesizing the kernel modules 606 expressly chosen for an application domain of the application 304. The application 304 can be loaded and executed on the reconfigurable hardware devices 202.

The application domain refers to a type of a number of the application 304 that are grouped based on similar functionalities. The application domain depends on problems that the number of the application 304 is implemented to solve. For example, the application domain can include encryption, computer vision, and synthetic-aperture radar that can be supported with high-performance computing functionalities implemented in the number of the application 304.

The application 304 can be launched in a layer outside each of the kernel units 406 having the microkernel 604 and the kernel modules 606. For example, the application 304 can be developed using a programming language including C++ and VHSIC hardware description language (VHDL) where VHSIC stands for very-high-speed integrated circuits. Also for example, the application 304 can be developed with Open Computing Language (OpenCL) programs and compiled to run with an execution platform with only hardware using the reconfigurable hardware devices 202.

The application 304 can be mapped to and executed by the reconfigurable hardware devices 202. A procedure of mapping and executing a representation or a bitstream of the application 304 can be managed by each of the kernel units 406 with the microkernel 604 and the kernel modules 606.

Figure 7:
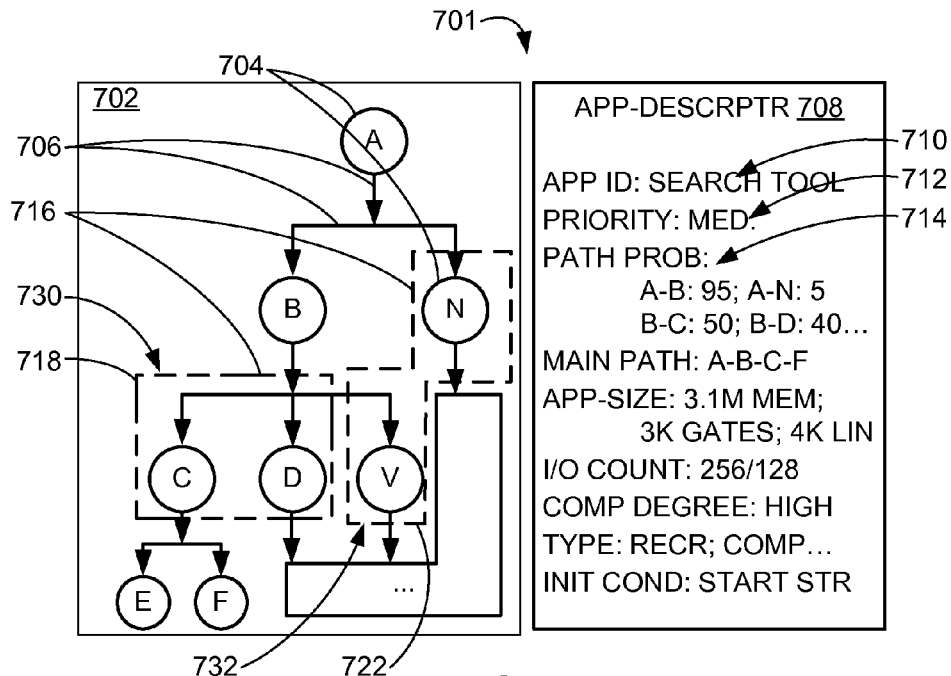
FIG. 7 is an exemplary block diagram of an application file for the application of FIG. 3.

Referring now to FIG. 7, there in is shown an exemplary block diagram of an application file 701 for the application 304 of FIG. 3. The application file 701 is defined as a bit stream containing information used to form circuitry to instantiate and implement the application 304. The application file 701 can be stored in a file system. The application file 701 can have an application-tree 702. An instance of the application-tree 702 can appear as a formatted array of bit streams.

The application 304 can be implemented using the kernel units 406 of FIG. 4. The user can be a person using the computing system 100 of FIG. 1, an operating system running within or coupled to the computing system 100, or an instance of the kernel units 406 interacting with another. For example, the main kernel instance 408 of FIG. 4 can be the user to the coupled kernel instance 410 of FIG. 4 when managing and controlling a resource within the coupled kernel instance 410.

The application 304 can be represented by the application-tree 702. The application-tree 702 is defined as a progressive partitioning of the application 304. The application-tree 702 can have each of the partitions represented by nodes 704. For example, the application 304 can be implemented in one monolithic circuitry or multiple circuit portions as represented by the nodes 704 within the application-tree 702.

The nodes 704 can be a representation for synthesized bit streams created according to descriptions encoded in a hardware description language that represent the respective portions at the degree of granularity represented by the node. For example, nodes B and N can be of smaller granularity than that of A. The nodes 704 can be circuit layout or descriptions that can be used to create circuitry in the reconfigurable hardware device 202 of FIG. 2.

The application-tree 702 can also represent the relationship between the nodes 704 using arcs 706. The arcs 706 can indicate parent-child relationships between the nodes 704. For example, the complete circuit contained in node A can be reproduced by the sum of the contents of nodes B and N.

The application file 701 can have an application-descriptor 708. The application-descriptor 708 is defined as detailed information regarding the nodes 704 making up the application 304. The application file 701 can have the application-descriptor 708 as a header to the bit stream for the application-tree 702.

The application-descriptor 708 can have the application characteristic 506 of FIG. 5. The application characteristic 506 can also include a total number of the nodes 704 within the application-tree 702, a profile for decimating circuit fragments, counts for overall inputs and outputs, internal connections, number of memory segments and their sizes, maximum amount of required memory, beginning and end points of the bit streams, or a combination thereof.

For example, the application-descriptor 708 can have an application-identification 710, a priority designation 712, or a path-probability 714. The application-identification 710 can be used to identify the application 304 and the priority designation 712 can be the level of priority associated with executing the application 304. The path-probability 714 can be the likelihood of a certain sequence of circuitry within the application 304 being used at any given time.

Also, for example, the application-descriptor 708 can have a total number of inputs and outputs for each fragment of the application 304, a maximum amount of memory the application 304 can use, a description of the computational complexity of the application 304. The application-descriptor 708 can be formed by the developer, the computing system 100, or a combination thereof.

Each of these bit streams making up the application 304 can be a synthesized permutation of the nodes 704 summarized in the application-descriptor 708. The size and capacity of each of the nodes 704 can be different.

The formatted array of bit streams represents the different partitions of the application 304. For example, the computing system 100 can instantiate the application 304 in the reconfigurable hardware devices 202 as a single contiguous block indicated as node A. Alternatively, the computing system 100 can instantiate the application 304 as multiple circuit fragments such as a combination of nodes B and N in the reconfigurable hardware devices 202. Each fragment can have their own inputs and outputs, which can be interconnected through the communication network 502 of FIG. 5.

Instantiation is defined as the act of forming physical manifestations of a circuitry. For example, the kernel units 406 can instantiate the application 304 in the reconfigurable hardware devices 202 by connecting or configuring the gates or transistors in programmable logic devices, such as a field-programmable gate array (FPGA) or a complex programmable logic device The application-tree 702 can contain all known partition descriptions of the application 304 organized in an ordered fashion. The computing system 100 can also divide the application-tree 702 into fragments of varying granularities. For example, the computing system 100 can divide the application-tree 702 of a search tool into a combination of nodes B and N, node D, node V, and a further layout of nodes E and F.

It has been discovered that the nodes 704 and their corresponding circuitry provide efficient use of resources in the reconfigurable hardware devices 202. The nodes 704 allow the application 304 to be instantiated in multiple smaller pieces that can fit into the unused portions of the reconfigurable hardware devices 202 rather than requiring one monolithic grouping of unused portions.

The computing system 100 can group the nodes 704 according to available resources. The computing system 100 can form fragment layouts 716, which is defined as groupings of the nodes 704. The computing system 100 can form the fragment layouts 716 according to the various groupings of available resources available at different locations within the computing system 100.

For example, the computing system 100 can calculate the fragment layouts 716 as a layout section 718, a further layout section 722, or a combination thereof. The further layout section 722 and the further layout section 722 is defined as groupings of the nodes 704 in the application-tree 702, and can be exclusive groupings that do not overlap. For a more specific example, the layout section 718 can have nodes C and D or nodes F and D. The further layout section 722 can have nodes V and N or only node V.

The computing system 100 can form the hardware circuitry in the reconfigurable hardware devices 202 corresponding to the nodes 704. The computing system 100 can form a fragment circuitry 730 and a further circuitry 732 corresponding to the nodes 704. The computing system can use the fragment circuitry 730, the further circuitry 732, or a combination thereof to instantiate the application 304 in its entirety, or a portion of the application 304.

For example, the computing system 100 can form the fragment circuitry 730 corresponding to the nodes 704 in the layout section 718. The computing system 100 can form the further circuitry 732 corresponding to the nodes 704 in the further layout section 722. The fragment circuitry 730 can be the circuitry corresponding to node B or E and the further circuitry 732 can be the circuitry corresponding to node V, N, or a combination thereof.

For illustrative purposes, the computing system 100 is described as calculating two instances of the fragment layouts 716 and two corresponding circuit fragments. However, it is understood that the computing system 100 can calculate various number of layouts and instantiate various number of circuit fragments. For example, the application 304 can be instantiated as one monolithic block of circuitry corresponding to node A or blocks of circuitry corresponding to each of the nodes 704 having the smallest granularity in the application-tree 702.

The computing system 100 can instantiate the application 304 in a single instance of the clusters 404 of FIG. 4 or across the computing system 100 in multiple instances of the clusters 404. For example, the circuit fragments can be spread across multiple instances of the reconfigurable hardware devices 202 coupled directly to many different instance of the clusters 404.

Continuing with the example, the main kernel instance 408 can form the fragment circuitry 730 in the reconfigurable hardware devices 202 directly coupled thereto. The main kernel instance 408 can send the further layout section 722 to the coupled kernel instance 410, which can be the tandem kernel 402 of FIG. 4 or in a different location within the computing system 100. The coupled kernel instance 410 can receive and handle the further layout section 722 as an instance of an application, similar to the way the main kernel instance 408 receives and handles the application 304.

It has been discovered that circuit fragments, including the fragment circuitry 730 and the further circuitry 732 provide efficient use of resources in the reconfigurable hardware devices 202. The fragment circuitry 730 and the further circuitry 732 allow the application 304 to be instantiated in multiple smaller pieces that can fit into the unused portions of the reconfigurable hardware devices 202 rather than requiring one monolithic circuitry.

It has also been discovered that the fragment circuitry 730 and the further circuitry 732 provide accelerated performance for implementing the application 304. The fragment circuitry 730 and the further circuitry 732 can break up the application 304 into smaller pieces of hardware that can be formed and accessed within few clock cycles, and also instantiated and accessed in parallel to other coexisting applications.

Figure 8:
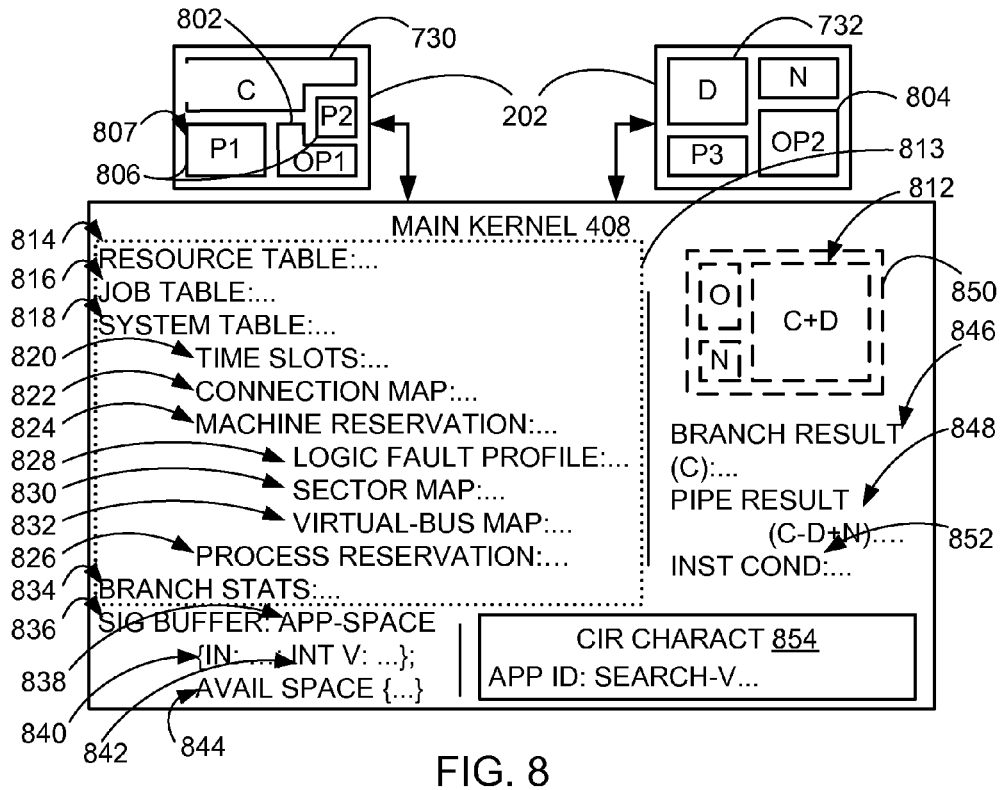
FIG. 8 is an exemplary block diagram of the application on an instance of the clusters of FIG. 4.

Referring now to FIG. 8, there in is shown an exemplary block diagram of the application 304 of FIG. 3 on an instance of the clusters 404 of FIG. 4. The reconfigurable hardware devices 202 directly coupled to the main kernel instance 408 can have unoccupied or unreserved resources, such as sections of logic or connections, as shown by an unoccupied logic-sector 802 and a further-available logic-sector 804.

The reconfigurable hardware devices 202 can also have occupied logic 806. The occupied logic 806 can be portions or resources within the reconfigurable hardware devices 202 that has been configured as a circuit for a separate application 807. The occupied logic 806 can be a set of resources used to implement the separate application 807.

The computing system 100 of FIG. 1 can form hardware circuitry for implementing the application 304 or a portion thereof in the reconfigurable hardware devices 202. For example, the computing system 100 can form the fragment circuitry 730, the further circuitry 732, or a combination thereof in the reconfigurable hardware devices 202.

The computing system 100 can connect the circuit fragments in a specified order to form a pipeline 812. The pipeline 812 is defined as a set of circuitry connected in sequence to implement the application 304 or a portion thereof. For example, the pipeline 812 can be the fragment circuitry 730 connected to the further circuitry 732. Also, for example, the pipeline 812 can be a connection between the fragment circuitry 730, the further circuitry 732, any up or downstream circuitry, or a combination thereof located within one or multiple instances of the clusters 404.

The main kernel instance 408, as an example of the kernel units 406 of FIG. 4 within each the clusters 404, can have a database 813 having various tables. The database 813 is defined as a designated hardware memory that stores collection of various data and tables required for structuring the operations and functions of each of the kernel units 406. The database 813 can be implemented using a dedicated memory module, such as non-volatile flash memory, random access memory, set of registers, or a portion thereof.

The database 813 can organize and store data in tables for controlling orders for operating different circuit fragments or input-output data to and from various portions of the application 304. The database 813 can have portions structured as and designated for a resource table 814, a job table 816, and a system table 818.

The resource table 814 is defined as hardware memory within the database 813 configured to store a record of unused or idle system resources. For example, the resource table 814 can store information identifying unused or idle virtual bus segments or portions of the reconfigurable hardware devices 202.

The job table 816 is defined as hardware memory within the database 813 configured to store a record of a present state of the main kernel instance 408. The job table 816 can store scheduling information for the main kernel instance 408. The job table 816 can store identification, state, schedule information, or a combination thereof relating to various circuitries managed by the main kernel instance 408.

The job table 816 can be initialized or reset to be empty or store zeros in all available storage spaces. The job table 816 can be populated as the main kernel instance 408 receives the application 304. The job table 816 can further be accessed and changed during an optimization activity.

The system table 818 is defined as hardware memory within the database 813 configured to store a set of operational elements characterizing the contents of the reconfigurable hardware devices 202. The system table 818 can contain time slots 820, a connection map 822, a machine reservation 824, and a process reservation 826.

The time slots 820 are defined as hardware memory within the database 813 configured to store an arrangement of time segments for accessing circuit segments within the reconfigurable hardware devices 202. Each of the time slots 820 can be a duration of time. Each of the time slots 820 can be used to activate one designated circuit segment. The designated circuit segment can be used to execute for calculating a result during the corresponding instance of the time slots 820. The time slots 820 can be used to order the rest of the information in the system table 818.

The connection map 822 is defined as hardware memory within the database 813 configured to store and track a record of connections between inputs, outputs, or a combination thereof corresponding to each of the time slots 820. The connection map 822 can describe the connections necessary to connect an output of a circuitry in one of the time slots 820 as an input to a different circuitry in following sequential instance of the time slots 820.

For example, the connection map 822 can be a list of connections or routes linking the output of the fragment circuitry 730 to the input of the further circuitry 732 or any other circuit connected downstream. Also, for example, the connection map 822 can describe the connection between the fragment circuitry 730, the further circuitry 732, any other circuit connected downstream or upstream, or a combination thereof.

The machine reservation 824 is defined as hardware memory within the database 813 configured to store a schedule of accessing circuits corresponding to the time slots 820. The machine reservation 824 can be the identification or the location of the circuits for each of the time slots 820. For example, the machine reservation 824 can have the identification of the fragment circuitry 730, the further circuitry 732, any other circuitry related to any of the applications instantiated within the computing system 100, or a combination thereof ordered according to the time slots 820.

The number of entries in the machine reservation 824 can dynamically vary. Each entry in the machine reservation 824 can be a fragment of a circuit that may itself be a complete circuit. The machine reservation 824 can have a logic fault profile 828, a sector map 830, and a virtual-bus map 832 for each entry in the machine reservation 824.

The logic fault profile 828 is defined as hardware memory within the database 813 configured to store and track a status of each of the circuit fragments and their relationships to other circuit fragments in the pipeline 812. For example, the logic fault profile 828 can state that a particular circuitry is active or have been decimated due to inactivity over a period of time. Also, for example, the logic fault profile 828 can state that a circuit is to be instantiated or formed according to an alarm condition. The logic fault profile 828 can have a probability for instantiating such virtual or decimated circuitry.

The sector map 830 is defined as hardware memory within the database 813 configured to store a description of the hardware circuitry instantiated in the reconfigurable hardware devices 202. The sector map 830 can have description of an identification of the circuit in relation to the corresponding application. The sector map 830 can also describe the location of the corresponding circuitry.

The virtual-bus map 832 is defined as hardware memory within the database 813 configured to store a description of all interconnects and binding information for a circuitry. The virtual-bus map 832 can include connections and arrangements of the circuitry and corresponding buffer segments up to the connection map 822.

The virtual-bus map 832 can have pointers to a list of scheduled input data residing in corresponding buffer segments. The virtual-bus map 832 can describe the connections and arrangements of circuit components within a fragment and the connection map 822 can describe the connections and arrangements between fragments.

The machine reservation 824 also include other information. For example, the machine reservation 824 can have a description of the amount of memory or table sizes corresponding to each circuitry. Also, for example, the machine reservation 824 can have the physical description of the size or capacity for each circuitry.

The process reservation 826 is defined as hardware memory within the database 813 configured to store a description of any process involving scheduled circuits. A process can link thread-enabled circuits synchronized via signal queues. The process reservation 826 can describe the list of circuits and connections that bear the signal instances for a corresponding process.

The process reservation 826 can include a pointer or pointers to the logic fault profile 828, the sector map 830, the virtual-bus map 832, or a combination thereof. The process reservation 826 can be used to describe the pipeline 812 using the various pointers for handling an input through the pipeline 812.

The database 813 can also have branch statistics 834 corresponding to the circuit fragments implementing the application 304. The branch statistics 834 are defined as numerical assessments related to the frequency of use corresponding to each of the circuit fragments.

For example, the main kernel instance 408 can have the branch statistics 834 reporting a total number of accesses, a number of accesses over a period of time, an amount of time since the last access, or a combination thereof. The branch statistics 834 can have values corresponding to circuit fragments, such as the fragment circuitry 730 or the further circuitry 732.

It has been discovered that the database 813 having the resource table 814, the job table 816, the system table 818, and the branch statistics 834 provide accessibility of data and status for the kernel units 406 across the computing system 100. The database 813 and the various tables and statistics provide for instant accessibility of data and status by organizing current location and status of all circuits instantiated within the computing system 100 in one location.

Each of the kernel units 406 can also have a signal buffer 836. The signal buffer 836 is defined as storage areas for holding data related to all applications being instantiated within each of the kernel units 406. For example, the main kernel instance 408 can have the signal buffer 836 for storing input, output, intermediate, or dynamic data pertaining to each pipeline managed by the main kernel instance 408.

The signal buffer 836 can have portions thereof designated for each application. For example, the main kernel instance 408 can have an application-space 838 within the signal buffer 836 for storing data related to the application 304. The application-space 838 can hold a buffered-input 840 to be used as input data to a circuit fragment and intermediate-variables 842 necessary to use the circuit fragment. The portion within the signal buffer 836 not designated for any application and free for usage can be available-space 844.

The circuit fragments within the reconfigurable hardware devices 202 can produce outputs such as a branch-calculation result 846 and a pipe-result 848. The branch-calculation result 846 is defined as a calculated result, such as a bit or a digital word, from one instance of the circuit fragment. The branch-calculation result 846 can be stored in the signal buffer 836 as the buffered-input 840, become an instance of the intermediate-variables 842, passed as an input to a downstream circuitry, or a combination thereof.

The pipe-result 848 is defined as a calculated result, such as a bit or a digital word, from a sequence of circuit fragments making up the pipeline 812. The pipe-result 848 can be stored in the signal buffer 836 as the buffered-input 840, become an instance of the intermediate-variables 842, passed as an input to a downstream circuitry or other pipelines, returned to a shell structure coupled to or within the computing system 100 or a combination thereof.

The kernel units 406 can also calculate an optimization result 850. The optimization result 850 is defined as a scheme for organizing the application 304. The optimization result 850 can be a result of an optimization procedure for maximizing the use of resources in supporting various applications within the computing system 100.

The optimization result 850 can be a physical regrouping, reformation, alteration, relocation, or a combination thereof for organizing the circuitry supporting each of the applications. The optimization result 850 can also be a temporal rearrangement of the contents within the time slots 820 representing different applications or portions thereof.

The optimization result 850 can account for the circuits being implemented in other kernel units. For example, the optimization result 850 can account for the further circuitry 732 instantiated through the coupled kernel instance 410 of FIG. 4 to support the application 304. The main kernel instance 408 can interact with the coupled kernel instance 410 to calculate the optimization result 850.

It has been discovered that the optimization result 850 can provide convergence to optimal and efficient usage of the resources by the computing system 100. The optimization result 850 can provide optimal and efficient usage of the resources by reorganizing the circuit fragments, such as the fragment circuitry 730, the further circuitry 732, or a combination thereof, and contents of the database 813 at regular or event based intervals.

The kernel units 406 can also determine an instantiation condition 852 for instantiating circuit fragments. The instantiation condition 852 is defined as the set of signals, states, conditions, or a combination thereof that can trigger the kernel units 406 to instantiate hardware.

The kernel units 406 can determine the instantiation condition 852 based on timing or conditions or states. For example, the kernel units 406 can set the instantiation condition 852 to next available clock cycle or opening in a schedule, or when the circuitry is in an inactive state with no signals to handle.

The kernel units 406 can also determine the instantiation condition 852 using the signals or conditions necessary to require access to a portion of the application 304. The kernel units 406 can set output values of other circuit portions, the information regarding the nodes 704 of FIG. 7 connected to the portion, the arcs 706 of FIG. 7, or their hardware or signal equivalents, or a combination thereof as the instantiation condition 852.

The kernel units 406 can use the instantiation condition 852 in supporting virtual hardware. The kernel units 406 can virtually support a portion of the application-tree 702 of FIG. 7 by having the layout for the portion but not instantiating the corresponding circuitry until the instantiation condition 852 is met.

It has been discovered that the instantiation condition 852 effectively provide increased capacity for the reconfigurable hardware devices 202. The instantiation condition 852 effectively provide increased capacity by allowing virtual hardware support, where rarely used hardware circuitry can become instantiated only when needed to free up more resources within the reconfigurable hardware devices 202 overall.

The kernel units 406 can determine a circuit characteristic 854 when sending an instance of the fragment layouts to be instantiated as hardware circuitry at a different instance of the kernel units 406. Continuing with the example, the main kernel instance 408 can form the circuit characteristic 854 when sending the further layout section 722 of FIG. 7 to the coupled kernel instance 410.

The circuit characteristic 854 is defined detailed information regarding the nodes 704 to be instantiated at a different instance of the kernel units 406. For example, the main kernel instance 408 can have instantiated the fragment circuitry 730. The main kernel instance 408 can send the further layout section 722 and the circuit characteristic 854 to the coupled kernel instance 410.

The coupled kernel instance 410 can instantiate the further circuitry 732 through the coupled kernel instance 410. The coupled kernel instance 410 can instantiate the further circuitry 732 as the main kernel instance 408 instantiating the fragment circuitry 730. The coupled kernel instance 410 can receive and use the circuit characteristic 854 similar to the main kernel instance 408 receiving and using the application-tree 702, the application-descriptor 708 of FIG. 7, or a combination thereof.

The circuit characteristic 854 can be a smaller scaled instance of the application-tree 702, the application-descriptor 708, or a combination thereof. The application-tree 702 and the application-descriptor 708 can pertain to the application 304 in whole and the circuit characteristic 854 can pertain to a portion of the application 304 described by the corresponding instance of the fragment layouts 716 of FIG. 7.

Figure 9:
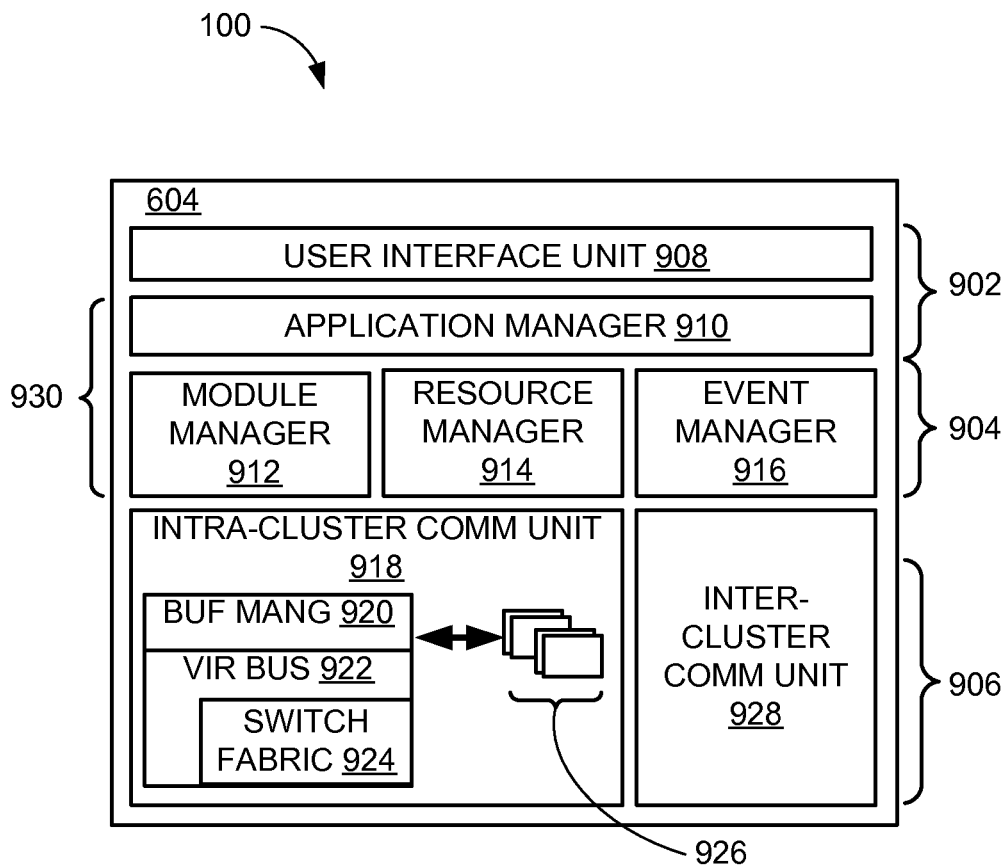
FIG. 9 is a hardware block diagram of the microkernel.

Referring now to FIG. 9, therein is shown a hardware block diagram of the microkernel 604. The microkernel 604 can be implemented with vital functions common to various types of a number of the application 304 of FIG. 3 that operates in a similar fashion across all application domains. The microkernel 604 does not operate in a stand-alone form but instead with the kernel modules 606 of FIG. 6.

The microkernel 604 can include operation functions including communications, logic multiplexing, security primitives, job scheduling, and distributed control. The microkernel 604 is an interworking system of sub-functions performed by units, organized as shown in FIG. 9. The microkernel 604 can include the sub-functions that are stratified into three layers including a control layer 902, a support layer 904, and a run-time layer 906.

The control layer 902 performs a job control and includes a microkernel interface (not shown). The control layer 902 can include a user interface unit 908 and an application manager 910 for performing control functions including session management, control plane security, and job scheduling.

The support layer 904 provides scheduling support and network management. The support layer 904 can include a module manager 912, a resource manager 914, and an event manager 916 for performing support functions including scenario validation, event handling, and remote kernel interface management.

The run-time layer 906 provides an application run-time plant. The run-time layer 906 can include run-time blocks including an intra-cluster communication unit 918 having a buffer manager 920 and a virtual bus 922 with a switch fabric 924. The run-time layer 906 can include the run-time blocks including a number of memory devices 926 and an inter-cluster communication unit 928. The run-time layer 906 can include the run-time blocks for performing run-time functions including interfacing with the reconfigurable hardware devices 202 of FIG. 2 and performing application fragment interconnect, signal management, network interface, and network and application interface security.

The microkernel 604 can include a schedule engine 930 for scheduling portions of a number of the reconfigurable hardware devices 202. The schedule engine 930 can include the application manager 910, the module manager 912, the resource manager 914, and the event manager 916 to support the scheduling. Details regarding the user interface unit 908, the application manager 910, the module manager 912, the resource manager 914, the event manager 916, the intra-cluster communication unit 918, and the inter-cluster communication unit 928 will be discussed in detail below.

Sub-blocks of the control layer 902, the support layer 904, and the run-time layer 906 can be connected to each other, the reconfigurable hardware devices 202, and the kernel modules 606. The control layer 902 can interface with the kernel modules 606 and the support layer 904. The support layer 904 can interface with the control layer 902 and the run-time layer 906. The run-time layer 906 can interface with the support layer 904, the reconfigurable hardware devices 202, and the kernel modules 606.

The microkernel 604 can be implemented as a functional foundation for the computing system 100 of FIG. 1, upon which the application 304 can be built such that the application 304 is secure and seamless. The microkernel 604 can embody a coherent collection of functionality appropriate for executing the application 304.

The microkernel 604 can provide primitives that implement functionality including application module scheduling and maintenance, seamless application fragment interaction, and high-performance application communication. The term "primitives" refers to a simple operation for executing a relatively more complex operation than the simple operation. For example, the primitives can represent low-level commands that are used to execute relatively high-level commands.

For example, the application module scheduling and maintenance can include thread maintenance and module swapping. Also for example, the seamless application fragment interaction can include interconnection and synchronization.

The thread maintenance monitors instantaneous application needs and regulates allocation of resources to the application 304. The thread maintenance is performed for multiple applications or processes.

For example, the thread maintenance can monitor the instantaneous application needs of the application 304 and allocate ancillary logic of the reconfigurable hardware devices 202 that has been swapped out to be used by the application 304. The term "ancillary" refers to spare logic gates that are swapped in to implement a function and swapped out to be available to implement another function when the spare logic gates are subsequently needed. Also for example, the thread maintenance can determine that a pipeline stall associated with feedback can require treatment.

The module swapping circumscribes or includes functionality associated with process scheduling including networked database support, identification of appropriate application fragment, run-time application fragment place and route, attachment and registration of application fragment alarms, and intra-application fragment signal handling configuration.

For the seamless application fragment interaction, the microkernel 604 can facilitate run-time synchronization at application grain boundaries including flow-control and management of pipeline stalls involving pipelines that span the application grain boundaries. The term "fragment" refers to a portion of the application 304.

The microkernel 604 can also provide for bus interconnection and reliable delivery of application signal information from outputs to fanned-out inputs at application fragment grain boundaries. The application fragment grain boundaries are perimeters of groups of programmable blocks in the reconfigurable hardware devices 202, where interconnects or wires are connected between the groups.

For the high-performance application communication, the microkernel 604 can provide a low-overhead communication infrastructure to the application 304 developed as any combination of software and hardware on top of or outside the microkernel 604 and the kernel modules 606. Wrappers or interfaces for the application 304 can be written in hardware or software outside the microkernel 604 and the kernel modules 606 to seamlessly adapt the low-overhead communication infrastructure to a number of protocols.

The user interface unit 908 is a portion within the management hardware that facilitates access and interaction functionalities with other entities. The user interface unit 908 can facilitate access and interactions between the kernel units 406 of FIG. 4 or between the kernel units 406 and the shell or the user using the computing system 100.

The user interface unit 908 can receive the application-tree 702 of FIG. 7 the application-descriptor 708 of FIG. 7, or a combination thereof for instantiating the application 304 in the reconfigurable hardware devices 202. The user interface unit 908 can also provide authentication and session support for the user after receiving the application-tree 702. The user interface unit 908 can structure access to the microkernel 604 through a session manager. The session manager can secure process identifiers and allocate session identifiers, which in combination can uniquely identify user sessions. The session manager can also provide a single system image for both local and remote access to the microkernel 604.

The user interface unit 908 can certify each exchange of information through the microkernel 604. Transactions entering the user interface unit 908 from logic external to the microkernel 604, such as the shell, can be authenticated. The log in transaction can be treated special and establish a user interface-session. The log in transaction can require no pre-existing user interface-session, but all other transactions can require a preexisting user interface-session to be effective. The user interface unit 908 can also support session encryption.

The user interface can regulate traffic between external logic and the microkernel 604. The flow of information can be bidirectional between the microkernel 604 and the external logic or between the kernel units 406.

The application manager 910 is a portion of the management hardware for coordinating machine and process activity for the kernel units 406. For example, the application manager 910 can manipulate hardware circuitry for the main kernel instance 408 of FIG. 4. The application manager 910 can interwork with the support layer 904 to balance resource utilization with run-time flexibility and system priorities.

A machine is defined as a physical instance of a logic transformation pipeline. For example, the machine can include the hardware circuitry within the reconfigurable hardware devices 202 making up the pipeline 812 of FIG. 8, data connections including switches connecting the occupied circuits, or a combination thereof.

A process is defined as an exclusive stream of bits constituting a logical context. For example, the process can include command data for controlling and operating the kernel units 406, input, output, or intermediate values related to processing by the machine. The process can run through the machine. The machine can support many processes.

The application manager 910 can react to event notification and perform a combination of activation or suspension for process, machine, or a combination thereof. The process and machine mix can change incrementally, with few adds and few drops to the combination of the machines and processes being supported by the microkernel 604. An add operation that happens without a drop operation can either acquire the resources and prepare for operation or fail to schedule for the indicated time slot.

The application manager 910 can acquire the resources by using slack resources on the reconfigurable hardware devices 202. The application manager 910 can also acquire the resources by using resources from running processes or machines, causing either decimation or suspension of lower priority processes or machines.

The application manager 910 can also drop the process or the machine without performing the add operation. The application manager 910 can drop a process or a machine to bring up underequipped processes or applications to full strength. The application manager 910 can also drop a process or application to consolidate remaining processes or machines. The application manager 910 can further perform a drop operation to return slack resources for use by other applications.

The application manager 910 can combine the add operation and the drop operation to perform a combination of add and drop for process, machine, or a combination thereof in the same optimization cycle. The resources freed through the drop operation can be made available to the machine, the process, or a combination thereof that is to be added. An additional consolidation cycle can be applied after the addition of the machine, the process, or a combination thereof. Further, more than one machine, process, or a combination thereof may be added, dropped, or a combination thereof in a single optimization cycle.

The application manager 910 can employ a feedback loop involving the support layer 904 to introduce the application 304 to the schedule, retire the application from the schedule, manage schedule impact of suspension and activation operations for the application 304, or a combination thereof. The application manager 910 can further ensure clean state transitions as jobs proceed through their life cycle, support the execution of the application, or a combination thereof.

The module manager 912 is a portion of the management hardware for structuring the operations and functions of the microkernel 604. The module manager 912 can have the database 813 of FIG. 8 that includes various tables, such as the resource table 814 of FIG. 8 or the virtual-bus map 832 of FIG. 8. The module manager 912 can structure the operations and functions by managing the tables within the database 813.

The tables within the database 813 can drive the control plane of the microkernel 604. It has been discovered that the module manager 912 can effectively extend the purview of the control of the microkernel 604 beyond the boundaries of a single blade via the database 813 and the cross-connection network 302 of FIG. 3.

The module manager 912 can manage the database to organize all storage reachable by the computing system 100. It has been discovered that the database 813 can consolidate longer-term state into a single memory subsystem, which can then be scaled.

Since activity memory access priority varies, it has been further discovered that a single memory image provided through the database 813 results in less high-priority traffic congestion for a given memory traffic profile. In a prioritized traffic environment, bandwidth allocation via access control can enable management of the lower-priority congestion issues.

The module manager 912 can manage the database by handling the various tables. For example, the module manager 912 can open, close, flush, synchronize, merge, split, get, delete, sort, or a combination thereof for a table. Also, for example, the module manager 912 can get, delete, insert, change, or a combination thereof to an entry within any of the tables. For further example, the module manager 912 can verify or release a client session.

The module manager 912 can further manage optimization activity. The module manager 912 can contain the parameters for the optimization activity, the optimization algorithms, circuitry for scenario qualifications for the optimization activity, and the routing control circuitry sufficient to differentiate and schedule flow for a host of algorithms.

The module manager 912 can set up parameters for optimization, select and perform the optimization algorithm and interpret the results of an optimization cycle. The microcoded logic reflecting the algorithm can be run-time downloaded to control the optimization to conform to the up-to-the-moment needs of an in-progress optimization. The module manager 912 can handle the parameters according to the hardware implemented algorithm to optimize the resources within the cluster or across the computing system 100. The module manager 912 can further track the progress of the optimization activity.

The module manager 912 can interact with the application manager 910 and the resource manager 914 to add, delete, consolidate, or a combination of operations regarding machine, handle, or a combination thereof. The module manager 912 can use add, delete, consolidate, or a combination of operations to implement the result of the optimization activity.

The module manager 912 can place the application 304 or a portion thereof during either inception or an optimization activity using various tables within the database 813. The module manager 912 can use the database 813 to form placement scenarios.

Information tabulated at the kernel units 406 can build time funnels through the database 813 to the resource table 814 during database initial configuration. At kernel build time, all parameters can be identified by the module manager 912 concerning any dimension of the kernel units 406. The module manager 912 can load the static table images to the database 813. Once the initial configuration is complete, the tables can become dynamic as the system starts to run applications.

The module manager 912 can notify the rest of the computing system 100 of important events through the event manager 916. The module manager 912 can access information via the event manager 916 about selected events happening in the rest of the system.

For example, the module manager 912 can subscribe to the events related to system timer, logic faults for active machinery or processes, memory page faults for active machinery or processes, heartbeat monitor for all kernel planes under subscription, place and route pipeline error, or a combination thereof. Also, for example, the module manager 912 can register for the events related to database error, optimization out of bounds, server error, or a combination thereof.

The module manager 912 can launch a new machine or process, consolidate machines, processes, or a combination thereof, and manage the database 813. Details regarding the module manager 912 will be discussed below.

The resource manager 914 is a portion of the management hardware for supporting system operation of the microkernel 604. The resource manager 914 can support system operation by producing workable combinations of machines and processes from a diverse collection of system and application information via an array of test and qualification pipelines. The resource manager 914 can further support system operation by supplying a control console for the intra-cluster communication unit 918.

The resource manager 914 can support system operations to present the application manager 910 with tools that render information about and control of the reconfigurable hardware devices 202 and interconnect with selective precision and sweeping scope. The resource manager 914 can support system operations to enable the application manager 910 to correctly remake the pipeline 812 on any scale in relatively short order.

The resource manager 914 can supply various abstractions of available resources within the cluster for creating a new machine. For example, the resource manager 914 can determine the unoccupied logic-sector 802 of FIG. 8 and the further-available logic-sector 804 of FIG. 8 to characterize the available resources. The resource manager 914 can group various combinations of the resources according to different levels of abstractions to determine the unoccupied logic-sector 802 and the further-available logic-sector 804. It has been discovered that the resource manager 914 can enable orderly and efficient operation of the computing system 100 in dynamically creating and managing circuit fragments to support the application 304.

The event manager 916 is a portion of the management hardware for monitoring various events related to machines and processes within the cluster or across the computing system 100. An event can be a change in status relating to machines or processes within the cluster or the application 304 as implemented within the computing system 100.

For example, the even can be a change related to system timer, logic faults for active machinery or processes, memory page faults for active machinery or processes, heartbeat monitor across kernel planes, place and route pipeline error, or a combination thereof. Also, for example, the event can be changes related to database error, optimization out of bounds, server error, or a combination thereof. For further example, the event can be changes related to manipulation of a process or an access to a machine.

The event manager 916 can organize the events with programmable prioritization circuitry. The event manager 916 can recognize and sort events relevant to each of the fragments and avail the recorded events to other, machines, processes, kernel units, or a combination thereof.

The intra-cluster communication unit 918 is a portion of the management hardware for connecting different portions of the circuitry to form the circuit fragments and the pipeline 812. For example, the intra-cluster communication unit 918 can connect the different gates or transistors to form the circuit fragments, such as the fragment circuitry 730 of FIG. 7 or the further circuitry 732 of FIG. 7. Also, for example, the intra-cluster communication unit 918 can connect various circuit fragments to form the pipeline 812.

The intra-cluster communication unit 918 can have the virtual bus 922 having the switch fabric 924, and the memory devices 926. The virtual bus 922 is defined as a set of connections and switches that are used to connect machines to form the pipeline 812.

The intra-cluster communication unit 918 can form the virtual bus 922 to connect circuit fragments. The intra-cluster communication unit 918 can connect the combinations of switches or paths to connect the inputs and outputs of various circuit fragments and buffer locations according to their schedule or order of operation. The intra-cluster communication unit 918 can form the virtual bus 922 out of the switches or paths that connect the different fragments, buffer locations, or a combination thereof to form the pipeline 812.

The intra-cluster communication unit 918 can have the buffer manager 920 for managing the content of the memory devices 926. The buffer manager 920 is a portion of the management hardware for managing the information stored within the memory devices 926. The buffer manager 920 can configure the memory devices 926 to form the database 813.

The buffer manager 920 can designate portions within the memory devices 926 for various applications. For example, the buffer manager 920 can allocate a portion of the memory devices 926 as the application-space 838 of FIG. 8 and separate from the available-space 844 of FIG. 8. The application-space 838 can be used to store information, such as for the buffered-input 840 of FIG. 8 or the intermediate-variables 842 of FIG. 8, corresponding to the designated instance of the application 304.

The buffer manager 920 can connect the portions of the memory devices 926 to the circuit fragments. For example, the buffer manager 920 can use the virtual bus 922 to connect an input or an output of the fragment circuitry 730 to the application-space 838. Also, for example, the buffer manager 920 can interact with the inter-cluster communication unit 928 to connect the application-space 838 to circuit fragments existing in other instances of the kernel units 406.

The buffer manager 920 can support dynamic memory structures in implementing the application 304. The buffer manager 920 can designate a portion of the application-space 838 for the intermediate-variables 842 created during runtime of the application 304. The buffer manager 920 can clear the values for the intermediate-variables 842, free up the corresponding portion of the application-space 838, free up the buffer and circuitry connections corresponding to the intermediate-variables 842, or a combination thereof after the circuitry finishes using the intermediate-variables 842.

The inter-cluster communication unit 928 is a portion of the management hardware for connecting one instance of the kernel units 406 to other instances through the communication network 502 of FIG. 5. The inter-cluster communication unit 928 can facilitate the communication interface 504 of FIG. 5. The inter-cluster communication unit 928 can have a set of switches or connections for creating a connection between the clusters 404 of FIG. 4 through the kernel units 406.

The inter-cluster communication unit 928 can operate the set of switches to connect the correct set of the kernel units 406. For example, when the main kernel instance 408 instantiates the further circuitry 732 through the coupled kernel instance 410 of FIG. 4, the inter-cluster communication unit 928 within the main kernel instance 408 or within the coupled kernel instance 410, or both can connect the correct set of switches to connect the circuits in the main kernel instance 408 and the coupled kernel instance 410.

Figure 10:
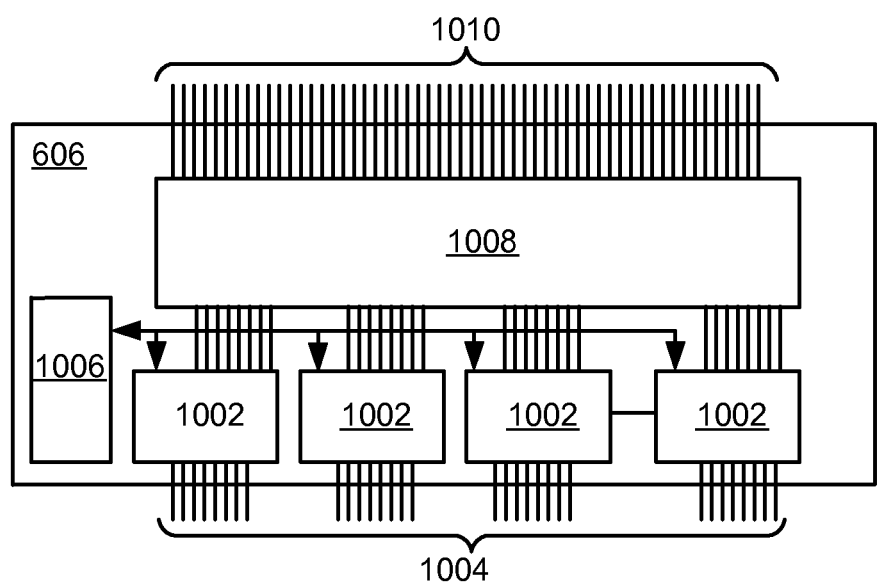
FIG. 10 is an architecture diagram of one of the kernel modules.

Referring now to FIG. 10, therein is shown an architecture diagram of one of the kernel modules 606. Each of the kernel units 406 of FIG. 4 can include the kernel modules 606 in addition to the microkernel 604 of FIG. 6 to provide hardware platform functionality that can spread across a number of the line cards 112 of FIG. 1, the tandem kernel 402 of FIG. 4, the kernel units 406 of FIG. 4, or a combination thereof. The kernel units 406 can be shaped or configured for the application domain with the kernel modules 606.

Each of the kernel modules 606 can include a microkernel interface unit 1002. The microkernel interface unit 1002 provides communication capability for each of the kernel modules 606 to communicate with the microkernel 604 through a kernel expansion bus 1004. The kernel expansion bus 1004 provides connectivity between the microkernel interface unit 1002 and the microkernel 604.

The microkernel interface unit 1002 can support a variety of bus widths and protocols appropriate to functionality of the microkernel 604. Each of the kernel modules 606 can include a security block 1006 to monitor a kernel module security status and determine whether each of the kernel units 406 operates in a secured mode.

Each of the kernel modules 606 can include a configurable functionality unit 1008 that interfaces between the microkernel interface unit 1002 and user logic devices. The user logic devices are non-kernel logic devices that are implemented outside the kernel units 406. The user logic devices can be used to transmit application related information of the application 304 of FIG. 3 that can be handled by the kernel units 406 for authentication, configuration, and management of the reconfigurable hardware devices 202 of FIG. 2. For example, the configurable functionality unit 1008 can interface with the user logic devices through a communication bus 1010 including Peripheral Component Interconnect (PCI) or a system bus on a motherboard or a system board.

The configurable functionality unit 1008 includes developed supplemental logic to support a number of configuration functionalities. For example, the configuration functionalities can be associated with the policy including module swapping rules, privilege and authentication rules, scheduling rules, function cache allocation, database management, and managing events and event relationships. Also for example, the configuration functionalities can be associated with interface domain diversity, high-usage application domain functions, issues of waiting logic, and system scalability.

For a specific example, interface domain diversity can imply behavioral sub classification. In other words, the kernel modules 606 house or include interface functionality based on a sub-classification because different interface domains have different characteristics. For instance, the different characteristics or differentiation can be based on speed and latency. Latency can be affected by inherent equipment constraints or by physical distance between nodes that represent locations of the reconfigurable hardware devices 202.

The kernel modules 606 can be implemented with the functionalities based on application parameters or features that are not implemented in the microkernel 604. For example, the kernel modules 606 can be implemented with functionalities including supports for shell programs and file systems.

The microkernel 604 and the kernel modules 606 can be implemented with any number of electronic components including an application-specific integrated circuit (ASIC), and a FPGA. For example, the microkernel 604 and the kernel modules 606 can altogether be implemented with an ASIC, an FPGA, or a combination thereof.

Figure 11:
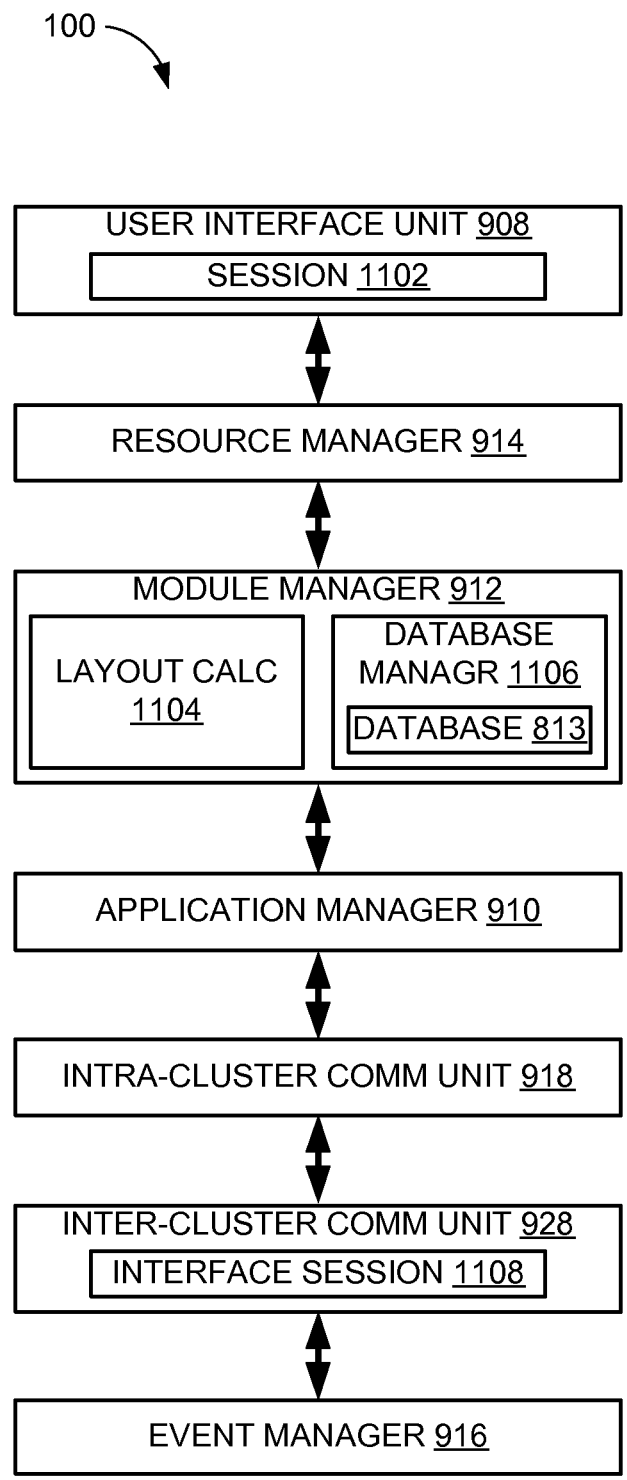
FIG. 11 is a control flow diagram of the computing system for instantiating the application of FIG. 3.

Referring now to FIG. 11, therein is shown a control flow diagram of the computing system 100 for instantiating the application 304 of FIG. 3. The control flow diagram can describe an order of operation for the microkernel 604 of FIG. 6. The control flow diagram can describe the operations in the microkernel 604 after the user of the computing system 100 initiates the application 304.

The computing system 100 can have the user interface unit 908 receive the application file 701 of FIG. 1 having the application-tree 702 of FIG. 7, the application-descriptor 708 of FIG. 7, or a combination thereof, or the application characteristic 506 of FIG. 5 through either direct interface or network connection. For example, the user interface unit 908 can receive the application file 701 through the kernel modules 606 of FIG. 6 or the inter-cluster communication unit 928 within the kernel units 406 of FIG. 4.

The user can provide a request or a command to start the application 304 and transmit the application file 701. The request or command can be issued by a person to run the application 304 in the computing system 100 through a shell. For example, the user can use a command prompt or user interfaces to issue a command to initiate the application 304.

The request or command can also be issued by an operating system. The operating system can start the application 304 according to the tasks required by the operating system. The request or command can further be issued from one of the kernel units 406 to another.

The mechanism for handling the request or command can find the application file 701 corresponding to the request or command. For example, the shell, the operating system, the instance of the kernel units 406 sending the application file 701 out, or a combination thereof can retrieve the application file 701 from a database or external storage. Also, for example, the instance of the kernel units 406 can calculate the circuit characteristic 854 of FIG. 8 from the application file 701 and send the circuit characteristic 854 to a different instance of the kernel units 406 for further handling.

The user interface unit 908 of FIG. 9 can receive the application 304 through the kernel modules 606, the cross-connection network 302 of FIG. 3, including the communication network 502 of FIG. 5, the communication interface 504 of FIG. 5, the intra-cluster communication unit 918, the inter-cluster communication unit 928, or a combination thereof. For example, the user interface unit 908 can recognize and read the application file 701 from a multiplexed input stream of data or recognize information intended for the main kernel instance 408 of FIG. 4 transmitted through the cross-connection network 302.

The user interface unit 908 can initiate a session 1102 when the application file 701 is first passed to the computing system 100. The session 1102 is defined as a portion within the database 813 for storing a collection of identifiers and data used to access the application 304 being implemented in the computing system 100. The user interface unit 908 can initiate the session 1102 by storing identification information of the application 304, access password, access level, other access or interaction related information, or a combination thereof in the session 1102.

The user interface unit 908 can also interact with the buffer manager 920 of FIG. 9 to create the application-space 838 of FIG. 8 in the signal buffer 836 of FIG. 8. The user interface unit 908 can prompt the buffer manager 920 to create the application-space 838 in the signal buffer 836 according to maximum memory requirement or computational complexity information in the application-descriptor 708.

The user interface unit 908 can store pointers, data, identification and authentication information, time stamps, or a combination thereof for the session 1102 in the application-space 838. The user interface unit 908 can store the session 1102 in a designated order within the application-space 838. The computing system 100, the developer, the system manufacturer, or a combination thereof can predetermine the designation or format for the session 1102 and the contents of the application-space 838.

After the user interface unit 908 initiates the session 1102, the control flow can pass to the resource manager 914. The resource manager 914 can operate the kernel units 406 for determining available resources within the reconfigurable hardware devices 202 of FIG. 2 within a single instance or across multiple instances of the clusters 404 of FIG. 4 to implement the application 304.

The resource manager 914 can determine the resources available within the computing system 100 for instantiating the application 304. For example, the resource manager 914 can determine available resources, such as the unoccupied logic-sector 802 of FIG. 8 or the further-available logic-sector 804 of FIG. 8 within the reconfigurable hardware devices 202. The resource manager 914 can also determine which resources are not available, such as the occupied logic 806 of FIG. 8, within the reconfigurable hardware devices 202.

The instance of the kernel units 406 receiving the application 304 can identify available resources within its own instance of the clusters 404. For example, the main kernel instance 408 can use the resource manager 914 to search the reconfigurable hardware devices 202 directly connected to the main kernel instance 408 for available resources.

The resource manager 914 can identify available resources by prompting the module manager 912 to access the database 813. For example, the module manager 912 can return to the resource manager 914 the resource table 814 of FIG. 8 or entries therein, or the quantity of the time slots 820 of FIG. 8 or gates that can be freed up due to inactivity. The resource manager 914 can identify the returned portions as the unoccupied logic-sector 802 or the further-available logic-sector 804.

Also, for example, the resource manager 914 can read the database 813 directly. The resource manager 914 can set the entries within the resource table 814 as the unoccupied logic-sector 802 or the further-available logic-sector 804.

The resource manager 914 can calculate abstractions of the resources for optimizing the implementation of the application 304. The resource manager 914 can compare the returned data on available resources to the application-descriptor 708, the application-tree 702, or a combination thereof. The resource manager 914 can return the unoccupied logic-sector 802 and the largest granularity node in the application-tree 702 to the application manager 910 when the unoccupied logic-sector 802 is sufficient to handle the application 304 in its entirety.

When the unoccupied logic-sector 802 is insufficient to instantiate the application 304, such as when the application 304 is too big or all of the available resources cannot support the priority designation 712 of FIG. 7, the resource manager 914 can calculate alternate arrangements of the available resources. For example, the resource manager 914 can reorganize the unoccupied logic-sector 802, the further-available logic-sector 804, the time slots 820, or a combination thereof, such as abstractly from a square to a rectangle having the same area or by grouping the resources differently.

The resource manager 914 can identify available resources without changing or disturbing the occupied logic 806. The resource manager 914 can thus identify available resources in parallel with and while implementing the separate application 807 of FIG. 8.

After the available resources or the various abstractions thereof have been calculated, the control flow can pass to the module manager 912. The module manager 912 can have a layout calculator 1104 to manipulate the application-tree 702 and calculate the fragment layouts 716 of FIG. 7, and a database-manager 1106 to manage the database 813.

The layout calculator 1104 can calculate the fragment layouts 716 for instantiating the application 304 using portions according to the available resources. The database-manager 1106 can maintain and manipulate the database 813 to connect, schedule, and manage the circuit fragments in whole as the application 304.

The layout calculator 1104 can calculate the fragment layouts 716 according to the available resources determined by the resource manager 914. For example, the layout calculator 1104 can calculate the layout section 718 of FIG. 7, the further layout section 722 of FIG. 7, or both from the application-tree 702 according to the unoccupied logic-sector 802, the further-available logic-sector 804, or both. The fragment layouts 716 can be used to instantiate circuitry corresponding to the fragment layouts 716, such as the fragment circuitry 730 of FIG. 7 or the further circuitry 732 of FIG. 7, in the unoccupied logic-sector 802, the further-available logic-sector 804, or both.

The layout calculator 1104 can compare the various arrangements of the available resources to various groupings of the nodes 704 of FIG. 7. The layout calculator 1104 can calculate the fragment layouts 716 by determining the grouping of the nodes 704 and corresponding arrangement of the available resources.

For example, the layout calculator 1104 can calculate the fragment layouts 716 for dividing up the application-tree 702 according to the unoccupied logic-sector 802. The layout calculator 1104 can calculate the fragment layouts 716 as a collection of circuits and connections corresponding to a group of the nodes 704 that can fit within the unoccupied logic-sector 802.

Also for example, the layout calculator 1104 can compare various abstractions of the unoccupied logic-sector 802 and the further-available logic-sector 804 to various groupings of the circuits and connections for implementing the application 304. The layout calculator 1104 can select the set of groupings that fits one of the abstractions of the unoccupied logic-sector 802 and the further-available logic-sector 804 as instances of the fragment layouts 716.

The layout calculator 1104 can use procedures predetermined by the system developer, the application developer, or the computing system 100 to calculate the fragment layouts 716. For example, the layout calculator 1104 can use predetermined methods or algorithms stored in hardware memory or configured in preset circuitry to determine various groupings of the nodes 704 and the arrangement of the available resources. The layout calculator 1104 can further be preconfigured to use methods or algorithms that maximize all available resources or to leave a portion of the available resources unoccupied for further optimization.

The layout calculator 1104 can also use predetermined procedures to calculate the fragment layouts 716 according to a preference order. For example, having more of the fragments near each other or combining the nodes 704 can be preferred. Also, for example, the priority designation 712 can drive the layout calculator 1104 to prefer resources capable of handling the priority designation 712.

The layout calculator 1104 can implement the preference order using various methods. For example, the layout calculator 1104 can perform a search with different preference criteria starting from the highest preference to the lowest until the fragment layouts 716 are calculated. Also, for example, the layout calculator 1104 can assign various points according to the preferences and select the fragment layouts 716 that have the highest overall point value.

The layout calculator 1104 can also manage the time slots 820. The layout calculator 1104 can schedule the circuits corresponding to the fragment layouts 716 in the time slots 820. The layout calculator 1104 can order the circuit operations in the time slots 820 according to the priority designation 712.

The layout calculator 1104 can also remove or reschedule to a smaller time period the scheduled items in the time slots 820 that have the lowest value of the priority designation 712 or lower than that of the application 304. The layout calculator 1104 can schedule the circuits corresponding to the fragment layouts 716 in the freed instances of the time slots 820.

The layout calculator 1104 can also provide virtual hardware support. The layout calculator 1104 can reserve portions of the application-tree 702 having lower values of the path-probability 714 of FIG. 7 for instantiation based on an input condition or a state. For example, the layout calculator 1104 can calculate the further layout section 722 and the instantiation condition 852 of FIG. 8 corresponding to the further layout section 722 based on the application characteristic 506 or the application-descriptor 708 for implementing the further circuitry of the application 304.

The layout calculator 1104 can also assess the available resources in other instances of the clusters 404 through the database 813 and the signal buffer 836 when the application 304 cannot wholly be implemented within the current cluster. For example, the layout calculator 1104 can assess the available resources directly connected to the coupled kernel instance 410 of FIG. 4 when the application 304 is too large to fit in the available resources at the main kernel instance 408.

Continuing with the example, the layout calculator 1104 can interact with the resource manager 914 to calculate the further layout section 722 having the circuit characteristic 854 for implementing a lower portion of the application 304 through the coupled kernel instance 410. The layout calculator 1104 can send the further layout section 722 to the coupled kernel instance 410. The coupled kernel instance 410 can receive and handle the further layout section 722 similar to the main kernel instance 408 receiving and handling the application 304.

Continuing with the example, the layout calculator 1104 can determine the circuit characteristic 854 of the further layout section 722. The layout calculator 1104 can determine the circuit characteristic 854 by identifying the portion of the application-descriptor 708 corresponding to the further layout section 722.

For example, the layout calculator 1104 can determine the application-descriptor 708 to be the application characteristic 506, such as the size or type, associated with the further layout section 722. Also, for example, the layout calculator 1104 can combine a unique identifier with the application-identification 710 of FIG. 7, calculate the path-probability 714 for the further layout section 722 in light of the application-tree 702, adjust the priority designation 712 according to the calculated probability, and combine the results to determine the application-descriptor 708.

The database-manager 1106 can update the rest of the database 813 according to the newly scheduled machines. The database-manager 1106 can determine the system table 818 of FIG. 8 for connecting the fragment circuitry 730 to other portions of the application 304 through the pipeline 812 of FIG. 8 of circuitry. For example, the database-manager 1106 can determine, update, or adjust the database 813 to reflect the physical location of the newly scheduled machines or the machine reservation 824 of FIG. 8 according to the application-tree 702, the application-descriptor 708, or a combination thereof.

It has been discovered that the database-manager 1106 and the database 813 provide instant accessibility of data and status for the kernel units 406 across the computing system 100. The database-manager 1106 and the database 813 provide instant accessibility by organizing and updating current location and status of all circuits instantiated within the computing system 100 in one location.

The module manager 912 can then pass the control flow to the application manager 910. The application manager 910 can generate the overall circuitry for the application 304 in the reconfigurable hardware devices 202. The application manager 910 can form the hardware circuitry reflecting all of the application-tree 702 in the unoccupied logic-sector 802 when the unoccupied logic-sector 802 is sufficient for implementing all of the application 304 therein.

The application manager 910 can generate the fragment circuitry 730 or the further circuitry 732 for implementing a portion of the application 304 in the unoccupied logic-sector 802 when the unoccupied logic-sector 802 is insufficient to accommodate the application characteristic 506 or the application-descriptor 708, such as size or priority. For example, the application manager 910 can generate the fragment circuitry 730, the further circuitry 732, or a combination thereof in the unoccupied logic-sector 802. Also, for example, the application manager 910 can generate the circuitry when the instantiation condition 852 has been met.

The application manager 910 can form gates, connections, transistor combinations, or a combination thereof according to the fragment layouts 716. For example, the application manager 910 can form and arrange the gates in the reconfigurable hardware devices 202 according to the layout section 718 to form the fragment circuitry 730 or any other portions of the application 304.

The application manager 910 can also connect portions of the signal buffer 836 of FIG. 8 to the hardware circuitry. For example, the application manager 910 can connect inputs, outputs, intermediate values, intermediate input variables, or a combination thereof to portions of the signal buffer 836 for handling data using the hardware circuitry.

The application manager 910 can determine the size of the portions in the signal buffer 836, such as the necessary quantity of the intermediate-variables 842 of FIG. 8 or the capacity for holding the buffered-input 840 of FIG. 8, by analyzing the nodes 704 and the arcs 706 of FIG. 7 in the fragment layouts 716 corresponding to the applicable circuit portion. For example, the application manager 910 can count the quantity of the nodes 704 that are sequentially connected or identify the arcs 706 that are connected as inputs to an instance of the nodes 704.

The application manager 910 can configure the portions of the signal buffer 836 to have the data can shift through the designated portions of the signal buffer 836, such as in first-in-first-out (FIFO) configurations, or be accessed using commands, such as enable signals. For example, if the fragment circuitry 730 and the further circuitry 732 are designated to be parallel, the application manager 910 can configure a portion of the signal buffer 836 as a shift register and connected to output of the appropriate circuit to account for delays, such as longer connection paths, of the other circuit.

Also, for example, the application manager 910 can connect a portion of the signal buffer 836 to an output of the fragment circuitry 730 when the further circuitry 732 is designated to be connected to the output of the fragment circuitry 730 but has not been instantiated. The portion of the signal buffer 836 can store the output processes of the fragment circuitry 730 while the further circuitry 732 is formed in hardware. The application manager 910 can connect the portion of the signal buffer to the input of the further circuitry 732 and enable the data to flow from the signal buffer 836 to the further circuitry 732 for further handling.

It has been discovered that the application manager 910 and the signal buffer 836 having portions that are reconfigurable in size and format, and connectable to circuit portions provide improved application fidelity of the computing system 100. The improved fidelity is achieved by dynamically configuring the signal buffer 836 in length and placement to account for signal delays and asynchronous data transmissions due to having the application 304 in multiple fragments and in different physical locations.

It has also been discovered that the application manager 910 and the signal buffer 836 having portions that are reconfigurable in size and format, and connectable to circuit portions provide faster execution speeds while maintaining fidelity of the computing system 100. The improved execution speed and fidelity is achieved by dynamically configuring the signal buffer 836 in type, length, and placement to continuously operate existing portions of the circuitry and hold various data, while other portions of the circuitry is formed.

For supporting virtual hardware, the application manager 910 can forego instantiating the further circuitry 732 until the instantiation condition 852 has been satisfied. The event manager 916 can flag when the instantiation condition 852 has been satisfied. The application manager 910 can freeze the pipeline 812 and form the further circuitry 732 for implementing a different portion of the application 304 when the event manager 916 indicates that the instantiation condition 852 has been met.

For example, the event manager 916 can compare the input process, the buffered-input 840, the intermediate-variables 842, the status of the main kernel instance 408, or a combination thereof with the instantiation condition 852. The event manager 916 can notify the resource manager 914 when the input process, the buffered-input 840, the intermediate-variables 842, the status of the main kernel instance 408, or a combination thereof match the instantiation condition 852.

Continuing with the example, the resource manager 914 to identify available resources as described above for instantiating the instance of the fragment layouts 716 or a portion thereof corresponding to the instantiation condition 852. The application manager 910 can then instantiate the hardware circuitry corresponding to the instantiation condition 852 in the reconfigurable hardware devices 202 using the available resources.

Continuing with the example, the application manager 910 can configure a portion of the signal buffer 836 of FIG. 8 having a calculated length to hold possible input values for the virtualized hardware. The calculated length can be such that the signal buffer 836 will hold the necessary amount of input data or intermediate variables for when the virtual hardware becomes instantiated and the older, unnecessary data will be overwritten. The application manger 910 can connect the input of the instantiated circuit to the corresponding portion of the signal buffer 836 to handle the stored inputs or the stored intermediate variables.

It has been discovered that the signal buffer 836 having the calculated length for various portions provide efficient and simplified memory management. It has also been discovered that the application manager 910 and the signal buffer 836 having the calculated length provide faster execution time while remaining seamless from the user's perspective.

The application manager 910 can also suspend, highlight, decimate, or a combination thereof to the existing circuitry within the reconfigurable hardware devices 202. The application manager 910 can perform the various hardware manipulations simultaneously as described above.

It has been discovered that the application manager 910 and the circuit fragments provide efficient and uninterrupted use of resources in the reconfigurable hardware devices 202. The application manager 910 and the circuit fragments provide efficient and uninterrupted use of resources by creating and removing hardware for the application 304 without disturbing other existing applications.

The control flow can pass from the application manager 910 to the intra-cluster communication unit 918. The intra-cluster communication unit 918 can operate the switch fabric 924 of FIG. 9 according to the system table 818 to connect the circuit fragments to form the pipeline 812. For example, the intra-cluster communication unit 918 can connect the fragment circuitry 730, the further circuitry 732, the signal buffer 836 of FIG. 8, or a combination thereof directly coupled to the main kernel instance 408.

The intra-cluster communication unit 918 can also manage the signal buffer 836. The intra-cluster communication unit 918 can clear the signal buffer 836 according to the system table. For example, the intra-cluster communication unit 918 can delete contents in the application-space 838 after corresponding calculations or procedures finish.

The control flow can pass from the intra-cluster communication unit 918 to the inter-cluster communication unit 928. The inter-cluster communication unit 928 can connect the kernel units 406 according to the system table 818.

The inter-cluster communication unit 928 can also send portions of the application 304 to other kernels. For example, the inter-cluster communication unit 928 can send the further layout section 722 having the circuit characteristic 854 for forming the further circuitry 732 at the coupled kernel instance 410 to implement the lower portion of the application 304.

The inter-cluster communication unit 928 can establish an interface-session 1108 for accessing resources across the computing system 100. For example, the inter-cluster communication unit 928 can establish the interface-session 1108 at the main kernel instance 408 for accessing the reconfigurable hardware devices 202 directly coupled to the coupled kernel instance 410.

The interface-session 1108 is defined as a collection of identifiers and data used to access portions of the application 304 being implemented in a kernel existing in a different cluster. For example, the interface-session 1108 can be an address of or a pointer to the coupled kernel instance 410, an access code for the coupled kernel instance 410, identification information of the portion of the application 304 in the coupled kernel instance 410, a protocol for interacting with the coupled kernel instance 410, or a combination thereof.

The main kernel instance 408 can use the interface-session 1108 to interact with the coupled kernel instance 410. For example, the main kernel instance 408 can use the interface-session 1108 to send circuits for instantiating at the coupled kernel instance 410, send and receive data related to accessing the circuitry instantiated at the coupled kernel instance 410, optimize the overall circuitry for implementing the application 304 across multiple clusters, or a combination thereof.

The control flow can pass from the inter-cluster communication unit 928 to the event manager 916. The event manager 916 can watch for events, such as time outs or procedures scheduled for accessing various circuits. The event manager 916 can also notify other kernels or units within the main kernel instance 408 by flagging the event. The control flow can pass from the event manager 916 to the appropriate unit within the microkernel 604 according to the event after instantiating the application 304 to run the application 304.

The event manager 916 can also determine the branch statistics 834 corresponding to the fragment circuitry 730 for characterizing a usage of the fragment circuitry 730. The event manager 916 can count the number of times each circuit fragments have been accessed or the duration since the last access. The event manager 916 can set the count or the duration as the branch statistics 834.

Figure 12:
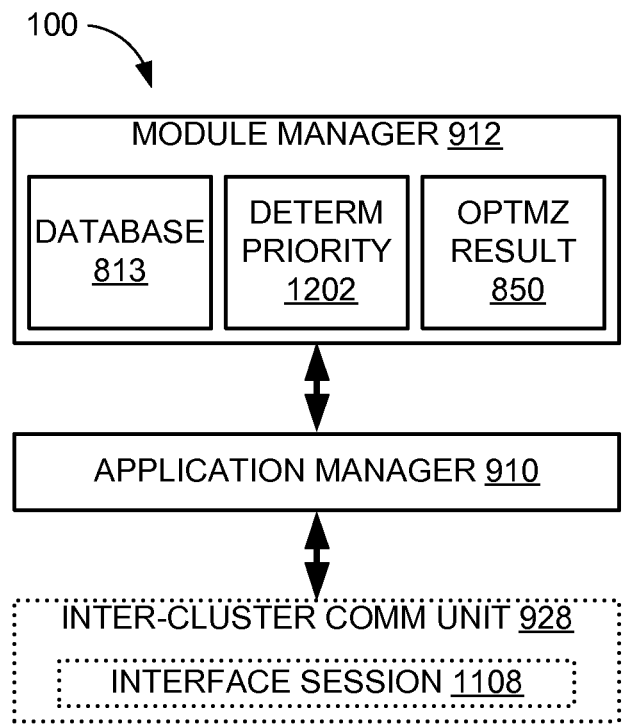
FIG. 12 is a further control flow diagram of the computing system for optimizing the application of FIG. 3.

Referring now to FIG. 12, therein is shown a further control flow diagram of the computing system 100 for optimizing the application 304 of FIG. 3. The further control flow diagram can describe an order of operation for the microkernel 604 of FIG. 6 in optimizing the application 304.

The event manager 916 of FIG. 9 can have a set of register values in the database 813 representing certain conditions, inputs, states, or a combination thereof required for starting optimization. The set of register values can be preconfigured by the computing system 100, the developer of the application 304, system developer, or a combination thereof.

The event manager 916 can compare the conditions, inputs, states, or a combination thereof to the set of register values stored in the database 813. The event manager 916 can issue an event corresponding to the optimization procedure when the conditions, inputs, states, or a combination thereof match the set of values.

The computing system 100 can initiate optimization by setting an event according to the time slots 820 of FIG. 8. During the instance of the time slots 820 designated for optimization, the module manager 912 can use the branch statistics 834 of FIG. 8 tracked by the event manager 916 of FIG. 9 to optimize the application 304.

The module manager 912 can calculate a determined priority 1202 of the fragment circuitry 730 of FIG. 7, the further circuitry 732 of FIG. 7, or a combination thereof based on the branch statistics 834. The determined priority 1202 is defined as a calculated value representing the importance or the usage frequency of the corresponding circuitry.

The module manager 912 can calculate the determined priority 1202 by comparing the branch statistics 834 with a threshold profile. The threshold profile can indicate a range of values for the branch statistics 834 corresponding to various levels or values for the determined priority 1202. The module manager 912 can assign the level or value corresponding to the branch statistics 834 on the threshold profile to the determined priority 1202.

The module manager 912 can calculate the optimization result 850 based on the branch statistics 834 for optimizing the reconfigurable hardware devices 202 of FIG. 2 to implement the application 304 and the separate application 807 of FIG. 8. The module manager 912 can calculate the optimization result 850 by recalculating and reordering the circuit fragments.

The module manager 912 can use entries in the database 813 to set up the optimization activity for calculating the optimization result 850. The entries in the database 813 can indicate the locations and priority of the circuit fragments supporting the application 304 and the separate application 807. The module manager 912 can use the location and priority information of the circuit fragments along with the determined priority 1202 and the branch statistics 834 as inputs to the optimization algorithm.

The module manager 912 can regroup the nodes 704 of FIG. 7 to recalculate circuit fragments for the application 304, the separate application 807, or both according to the optimization algorithm in calculating the optimization result 850. The module manager 912 can relocate the circuit fragments to reduce delays and promote efficiency in resource allocation in calculating the optimization result 850. The module manager 912 can also determine circuit fragments that can be suspended or decimated in calculating the optimization result 850.

In cases where the application 304 is implemented across the clusters 404 of FIG. 4, the module manager 912 can account for the resources being used at a different cluster in calculating the optimization result 850. The module manager 912 can calculate the optimization result 850 through the interface-session 1108 for optimizing a combination of the reconfigurable hardware devices 202 and the resource at the coupled kernel instance 410 of FIG. 4.

For example, the module manager 912 at the main kernel instance 408 of FIG. 4 can treat the available resources at the coupled kernel instance 410 as an instance of the unoccupied logic-sector 802 of FIG. 8. The module manager 912 can calculate the optimization result 850 to recalculate the circuitry to be instantiated through the coupled kernel instance 410.

Continuing with the example, the module manager 912 can send the recalculated circuitry to the coupled kernel instance 410 through the interface-session 1108. The coupled kernel instance 410 can receive the recalculated circuitry through its own user interface unit, instantiate the circuitry, and optimize the recalculated circuitry internally using its own module manager.

The module manager 912 can also adjust the time slots 820 according to the determined priority 1202, the optimization result 850, or a combination thereof. The module manager 912 can increase the presence of higher priority or frequently accessed circuit fragments in the time slots 820. The module manager 912 can decrease the presence of the lower priority or infrequently accessed circuit fragments in the time slots 820.

The module manager 912 can follow a predetermined method or procedure for assigning and adjusting the time slots 820. For example, the module manager 912 can assign a position for the fragment circuitry 730 in the time slots 820 only if the fragment circuitry 730 has been used within the last 10 seconds. Also, for example, the module manager 912 can give two adjacent positions within the time slots 820 during every cycle period for the fragment circuitry 730 having the highest priority level.

The module manager 912 can update the database 813 to reflect the various changes and adjustments based on the determined priority 1202, the branch statistics 834, or a combination thereof. For example, the module manager 912 can update and adjust the system table 818 of FIG. 8 according to the optimization result 850 for rearranging machines within the reconfigurable hardware devices 202 to optimize the application 304 and the separate application 807. Also, for example, the module manager 912 can update the time slots 820 according to the determined priority 1202, the branch statistics 834, or a combination thereof.

The control flow can pass from the module manager 912 to the application manager 910. The application manager 910 can implement the updated and optimized hardware circuitry in the reconfigurable hardware devices 202. The application manager 910 can also decimate the fragment circuitry 730, the further circuitry 732, or a combination thereof based on the branch statistics 834, the optimization result 850, or a combination thereof for maximizing a resource within the reconfigurable hardware devices 202.

For example, the application manager 910 can adjust the fragment circuitry 730, the further circuitry 732, portions therein, or a combination thereof according to the optimization result 850. Also, for example, the application manager 910 can decimate the existing machine in the reconfigurable hardware devices 202 and instantiate the optimization result 850 as a replacement.

It has been discovered that the combination of the module manager 912, the database 813, the determined priority 1202, the optimization result 850, the application manager 910, the fragment circuitry 730, and the further circuitry 732 provide hardware re-locatable in time and space for executing the application 304 without disturbing the application 304. The application manager 910 and the circuit fragments provide re-locatable hardware by creating and removing hardware for the application 304 at different locations and changing the presence in the time slots without disturbing other existing applications.

The control flow can pass from the module manager 912 to the inter-cluster communication unit 928 when the application 304 has been instantiated across multiple clusters. The inter-cluster communication unit 928 can send the information necessary to other clusters having the application 304 instantiated therein.

For example, the inter-cluster communication unit 928 can send the optimization result 850 through the interface-session 1108 for optimizing the combination of the reconfigurable hardware devices 202 and the resource at the coupled kernel instance 410. The optimization result 850 or a portion thereof can be used by the coupled kernel instance 410 to optimize the circuitry managed by the coupled kernel instance 410 and optimize the overall instantiation of the application 304.

Figure 13:
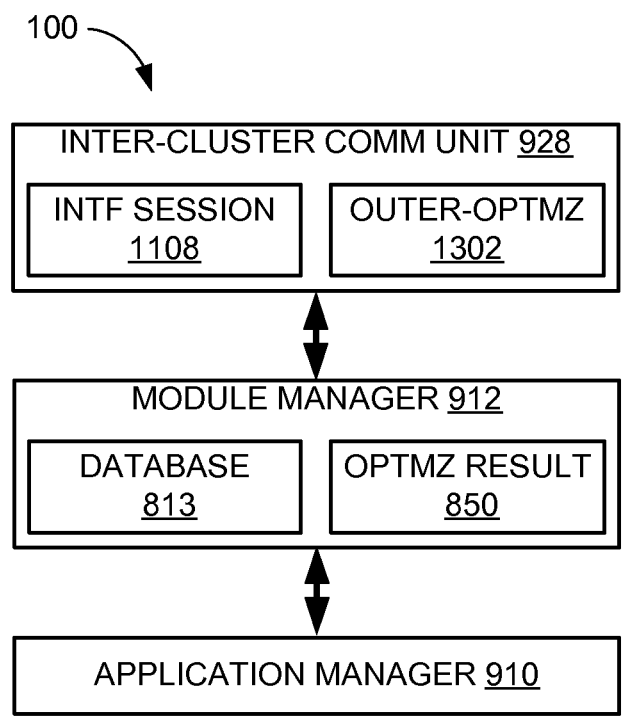
FIG. 13 is a different control flow diagram of the computing system for optimizing the application of FIG. 3 according to an outer-optimization.

Referring now to FIG. 13, therein is shown a different control flow diagram of the computing system 100 for optimizing the application 304 of FIG. 3 according to an outer-optimization 1302. The different control flow diagram can describe an order of operation for the microkernel 604 of FIG. 6 after receiving optimization related information from another instance of the kernel units 406 of FIG. 4.

The computing system 100 can initiate optimization by setting an event as described above. The optimization can be initiated in the instance of the kernel units 406 managing a starting point of the application 304. The optimization procedure can further involve any of the kernel units 406 supporting the application 304.

The kernel units 406 can implement a locally corresponding portion of an overall optimization plan. For example, the main kernel instance 408 of FIG. 4 managing the fragment circuitry 730 of FIG. 7 can receive an optimization plan calculated at the coupled kernel instance 410 of FIG. 4.

Continuing with the example, the coupled kernel instance 410 managing the further circuitry 732 of FIG. 7 can initiate the optimization plan and calculate the optimization result 850 of FIG. 8 when the further circuitry 732 includes a starting point for the application 304. The coupled kernel instance 410 can send a portion of the optimization result 850 corresponding to the fragment circuitry 730 to the main kernel instance 408 as the outer-optimization 1302.

Continuing with the example, the user interface unit 908 of FIG. 9 in the main kernel instance 408 can receive the outer-optimization 1302 through the interface-session 1108. The interface-session 1108 can allow communication between the inter-cluster communication unit 928 in the coupled kernel instance 410 for optimizing a combination of the further circuitry 732 at the coupled kernel instance 410 and the fragment circuitry 730 or the pipeline 812 of FIG. 8 having the fragment circuitry 730. The user interface unit 908 of the main kernel instance 408 can establish the session 1102 of FIG. 11 using the interface-session 1108 in the coupled kernel instance 410.

The user interface unit 908 can receive the optimization plan, such as the optimization result 850, from the coupled kernel instance 410. The user interface unit 908 can set the received optimization plan or the portion of the received plan corresponding to the main kernel instance 408 as the outer-optimization 1302.

The control flow can pass from the user interface unit 908 to the module manager 912. The module manager 912 can calculate the local optimization plan that accounts for the outer-optimization 1302. The module manager 912 can calculate the optimization result 850 that includes the outer-optimization 1302. For example, the module manager 912 can set the outer-optimization 1302 as one of the input parameters or as one of the requirements in calculating the optimization result 850.

The module manager 912 can update and adjust the database 813 according to the optimization result 850 that accounts for the outer-optimization 1302. For example, the module manager 912 can adjust the system table 818 of FIG. 8 or the time slots 820 of FIG. 8 according to the optimization result 850 for optimizing the combination of the further circuitry 732, and the fragment circuitry 730 or the pipeline 812 having the fragment circuitry 730, the further circuitry 732, or a combination thereof. The module manager 912 can use the procedure described above to update and adjust the database 813.

The control flow can pass from the module manager 912 to the application manager 910. The application manager 910 can implement the optimization result 850 in hardware as described above.

Figure 14:
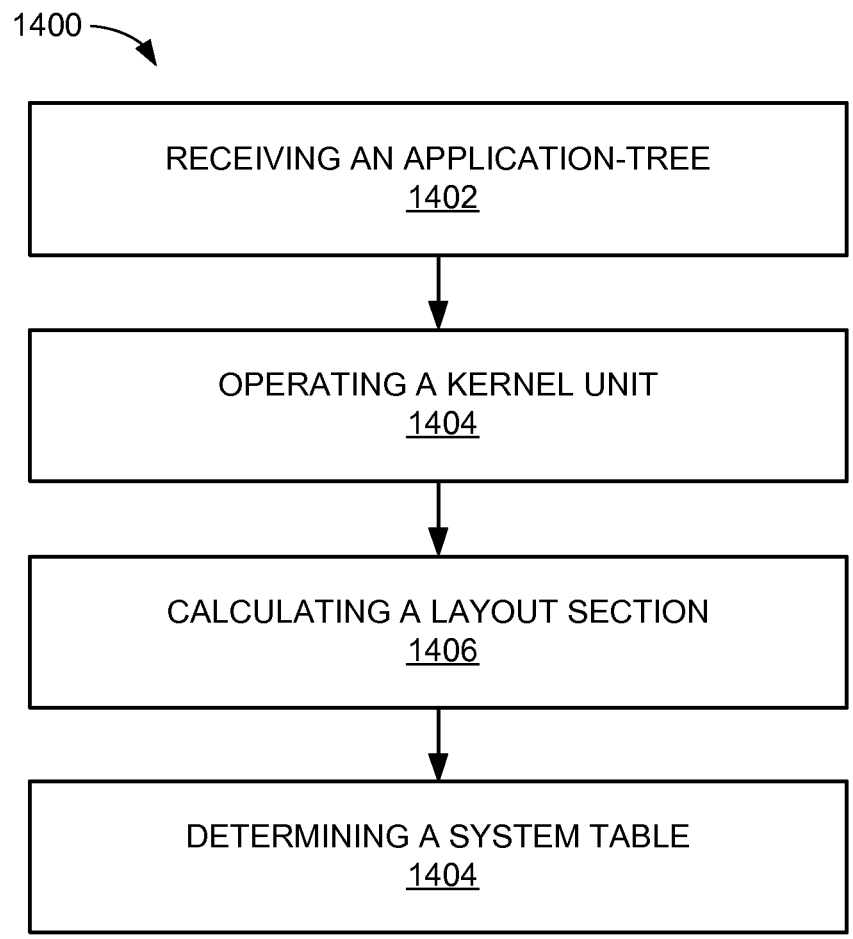
FIG. 14 is a flow chart of a method of operation of the computing system of FIG. 1 in a further embodiment of the present invention.

Referring now to FIG. 14, therein is shown a flow chart of a method 1400 of operation of the computing system 100 of FIG. 1 in a further embodiment of the present invention. The method 1400 includes: receiving an application-tree for instantiating an application in a reconfigurable hardware device in a block 1402; operating a kernel unit for determining an unoccupied logic-sector within a reconfigurable hardware device in a block 1404; calculating a layout section from the application-tree according to the unoccupied logic-sector for instantiating a fragment circuitry corresponding to the layout section in a block 1406; and determining a system table for connecting the fragment circuitry to other portions of the application to form the application having the fragment circuitry in a block 1408.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the computing system of the present invention furnishes important and heretofore unknown and unavailable solutions, capabilities, and functional aspects for improving reliability in systems, well-beings and quality of life of its occupants. The resulting procedures and configurations are straightforward, cost-effective, uncomplicated, highly versatile, and effective, can be implemented by adapting known technologies, and are thus readily suited for efficiently and economically manufacturing computing system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for operating a computing system comprising:
receiving an application-tree for instantiating an application in a reconfigurable hardware device;
operating a kernel unit for determining an unoccupied logic-sector within a reconfigurable hardware device;
calculating a layout section from the application-tree according to the unoccupied logic-sector for instantiating a fragment circuitry corresponding to the layout section; and
determining a system table for connecting the fragment circuitry to other portions of the application to form the application having the fragment circuitry including scheduling a time slot in a machine reservation for incorporating the fragment circuitry instantiated until the time slot.

2. The method as claimed in claim 1 further comprising:
receiving an application-descriptor for instantiating the application;
calculating a further layout section having an instantiation condition based on the application-descriptor for implementing a different portion of the application; and
forming a further circuitry for implementing the different portion of the application when the instantiation condition has been met.

3. The method as claimed in claim 1 further comprising:
determining a further-available logic-sector for implementing a different portion of the application through a coupled kernel instance;
calculating a further layout section having a circuit characteristic for instantiating a further circuitry corresponding to the further layout section;
sending the further layout section for forming the further circuitry through the coupled kernel instance to implement the different portion of the application; and
adjusting the system table for forming the application having the further circuitry.

4. The method as claimed in claim 1 further comprising:
calculating a further-available logic-sector for reallocating contents within the reconfigurable hardware device; and
adjusting the system table for relocating the fragment circuitry into the further-available logic-sector.

5. The method as claimed in claim 1 further comprising:
recalculating the fragment circuitry for rearranging the application; and
adjusting the system table for implementing the fragment circuitry after the recalculating.

6. The method as claimed in claim 1 wherein:
operating the kernel unit includes operating the kernel unit for determining the unoccupied logic-sector in the reconfigurable hardware device implementing a separate application; and
calculating the layout section includes calculating the layout section within the application-tree for fitting the fragment circuitry into the unoccupied logic-sector around the separate application while implementing the separate application.

7. The method as claimed in claim 6 wherein:
determining the system table includes determining the system table having time slots for scheduling the fragment circuitry; and
further comprising:
adjusting the time slots for rescheduling the fragment circuitry based on a determined priority.

8. The method as claimed in claim 6 further comprising:
forming a signal buffer for managing data required to implement the application;
adjusting the system table for implementing the signal buffer to produce a pipe-result; and
clearing the signal buffer according to the system table.

9. The method as claimed in claim 6 wherein:
receiving an outer-optimization through an interface-session for optimizing a combination of a further circuitry at the coupled kernel instance and the fragment circuitry; and
adjusting the system table according to the optimization result for optimizing the combination of the further circuitry and the fragment circuitry.

10. The method as claimed in claim 6 further comprising:
establishing an interface-session for accessing resources coupled to a coupled kernel instance;
calculating an optimization result for optimizing a combination of the fragment circuitry and a further circuitry coupled to the coupled kernel instance; and
sending the optimization result through the interface-session for optimizing the further circuitry.

11. The method as claimed in claim 6 further comprising:
determining a branch statistic corresponding to the fragment circuitry for characterizing a usage of the fragment circuitry; and
calculating a determined priority based on the branch statistic.

12. The method as claimed in claim 6 further comprising:
calculating an optimization result for optimizing the reconfigurable hardware device based on usage to implement the application and the separate application; and
adjusting the system table according to the optimization result for rearranging machines within the reconfigurable hardware device to optimize the application and the separate application.

13. The method as claimed in claim 6 further comprising decimating the fragment circuitry for maximizing a capacity of the reconfigurable hardware device based on usage.

14. The method as claimed in claim 6 wherein:
determining the system table includes determining the system table having time slots for scheduling the fragment circuitry; and
further comprising:
adjusting the time slots for removing a value corresponding to the fragment circuitry based on usage.

15. The method as claimed in claim 6 further comprising:
forming a signal buffer for managing data required by the reconfigurable hardware device;
setting an application-space within the signal buffer for managing data required by the pipeline; and
adjusting the application-space.

16. A computing system comprising:
a user interface unit for receiving an application-tree for instantiating an application in a reconfigurable hardware device;

a resource manager, coupled to the user interface unit, operating a kernel unit for determining an unoccupied logic-sector within a reconfigurable hardware device;

a layout calculator, coupled to the user interface unit, for calculating a layout section from the application-tree according to the unoccupied logic-sector for instantiating a fragment circuitry corresponding to the layout section; and a database-manager, coupled to the user interface unit, for determining a system table for connecting the fragment circuitry to other portions of the application to form the application having the fragment circuitry including scheduling a time slot in a machine reservation for incorporating the fragment circuitry instantiated until the time slot.

17. The system as claimed in claim 16 wherein:

the user interface unit is for receiving an application-descriptor for instantiating the application;

the resource manager is for calculating a further layout section having an instantiation condition based on the application-descriptor for implementing a different portion of the application; and further comprising:

an application manager, coupled to the user interface unit, for forming a further circuitry for implementing the different portion of the application when the instantiation condition has been met.

18. The system as claimed in claim 16 wherein:

the resource manager is for determining a further-available logic-sector for implementing a different portion of the application through a coupled kernel instance;

the layout calculator is for calculating a further layout section having a circuit characteristic for instantiating a further circuitry corresponding to the further layout section;

the database-manager is for adjusting the system table for forming the application having the further circuitry; and further comprising:

an inter-cluster communication unit, coupled to the user interface unit, for sending the further layout section for forming the further circuitry through the coupled kernel instance to implement the different portion of the application.

19. The system as claimed in claim 16 wherein:

the resource manager is for calculating a further-available logic-sector for reallocating contents within the reconfigurable hardware device; and the database-manager is for adjusting the system table for relocating the fragment circuitry into the further-available logic-sector.

20. The system as claimed in claim 16 further comprising:

the layout calculator is for recalculating the fragment circuitry for rearranging the application; and the database-manager is for adjusting the system table for implementing the fragment circuitry after the recalculating.

* * * * *